US012210041B2

(12) United States Patent
Yamaura

(10) Patent No.: US 12,210,041 B2
(45) Date of Patent: Jan. 28, 2025

(54) SENSOR UNIT

(71) Applicant: DENSO CORPORATION, Kariya (JP)

(72) Inventor: Satoshi Yamaura, Kariya (JP)

(73) Assignee: DENSO CORPORATION, Kariya (JP)

( * ) Notice: Subject to any disclaimer, the term of this patent is extended or adjusted under 35 U.S.C. 154(b) by 192 days.

(21) Appl. No.: 17/724,555

(22) Filed: Apr. 20, 2022

(65) Prior Publication Data

US 2022/0244296 A1 Aug. 4, 2022

Related U.S. Application Data

(63) Continuation of application No. PCT/JP2020/036369, filed on Sep. 25, 2020.

(30) Foreign Application Priority Data

Nov. 5, 2019 (JP) ................................ 2019-200960

(51) Int. Cl.
*G01R 15/20* (2006.01)
*H02M 7/5387* (2007.01)

(52) U.S. Cl.
CPC .......... *G01R 15/205* (2013.01); *G01R 15/20* (2013.01); *H02M 7/5387* (2013.01)

(58) Field of Classification Search
CPC .... G01R 15/20; G01R 15/202; G01R 15/205; G01R 15/207; H02M 7/5387; H02M 7/003; H02M 1/0009; H02M 1/007; H02M 1/008; H02M 3/003; H02M 3/158
See application file for complete search history.

(56) References Cited

U.S. PATENT DOCUMENTS

2009/0040724 A1* 2/2009 Nishikimi .......... H05K 7/20927 361/699
2013/0058143 A1* 3/2013 Tachibana .......... H05K 7/14329 363/131
2013/0320968 A1* 12/2013 Sakamoto ............ G01R 15/207 324/244
2017/0082659 A1 3/2017 Harada
2018/0113156 A1* 4/2018 Okuzuka .............. G01R 15/207

FOREIGN PATENT DOCUMENTS

JP 5263494 B2 8/2013
JP 2013-258843 A 12/2013
JP 2015-33201 A 2/2015
JP 6350785 B2 7/2018
JP 2018-121418 A 8/2018

* cited by examiner

*Primary Examiner* — David M Schindler
(74) *Attorney, Agent, or Firm* — Oliff PLC

(57) ABSTRACT

A sensor unit includes a first connection bus bar to a seventh connection bus bar connected to switch modules. The sensor unit includes a base integrally molding the first connection bus bar to the seventh connection bus bar. The sensor unit includes a plurality of magnetic-electric conversion units which detects current of the first connection bus bar to the seventh connection bus bar, respectively. The sensor unit includes a nut box connected to the base. The base and the nut box extends in the x-direction. A plurality of pillars, which are separated each other in the x-direction, are formed on the base. The nut box is fixed to the plurality of pillars by fixing bolts.

9 Claims, 13 Drawing Sheets

SENSOR UNIT

CROSS REFERENCE TO RELATED APPLICATION

The present application is a continuation application of International Patent Application No. PCT/JP2020/036369 filed on Sep. 25, 2020, which designated the U.S. and claims the benefit of priority from Japanese Patent Application No. 2019-200960 filed in Japan filed on Nov. 5, 2019, the entire disclosure of the above application is incorporated herein by reference.

TECHNICAL FIELD

The disclosure described herein relates to a sensor unit comprising a bus bar connected to the switch module and a magnetic-electric conversion unit for detecting a current flowing through the bus bar.

BACKGROUND

A motor system may include a power conversion device to control an electric power supplied to a motor. The power conversion device may needs a sensor to detect current to be controlled. The power conversion device requires a plurality of sensors. The power conversion device requires a certain level of accuracy even in a noise environment. In the above aspects, or in other aspects not mentioned, there is a need for further improvements in a sensor unit.

SUMMARY

The disclosure in this specification provides a sensor unit. The sensor unit comprises a plurality of bus bars arranged separately in a first predetermined direction, which are individually connected to each of a plurality of switch modules providing a part of a power conversion circuit. The sensor unit comprises an insulating resin case extending in the first predetermined direction, which connects the plurality of bus bars by embedding a part of each of the bus bars. The sensor unit comprises a plurality of magnetic-electric conversion units which are disposed in the resin case in a manner that the magnetic-electric conversion units face embedded portions of the bus bars embedded in the resin case in a second predetermined direction intersecting the first predetermined direction and detect currents flowing through the bus bars by detecting a magnetic field generated by flow of current flowing through one of the bus bars, respectively. The sensor unit comprises a support body which extends in the first predetermined direction and is connected to the resin case at two fixing points separated in the first predetermined direction.

In the sensor unit, the support body has a longer length in the second predetermined direction and has a higher rigidity than the resin case.

In the sensor unit, the support body includes: an insulating resin body; and a plurality of nuts which are arranged apart from each other in the first predetermined direction, and are connected with the resin body in a manner of being partially embedded. In the sensor unit, through holes are formed in exposed portions of the plurality of bus bars exposed from the resin case. In the sensor unit, the plurality of nuts and the plurality of bus bars are arranged to face each other in a manner that a bolt hole of the nut and the through hole are placed in a continuous manner.

BRIEF DESCRIPTION OF DRAWINGS

The disclosure is further described with reference to the accompanying drawings in which.

DESCRIPTION OF EMBODIMENT

Figure 1:
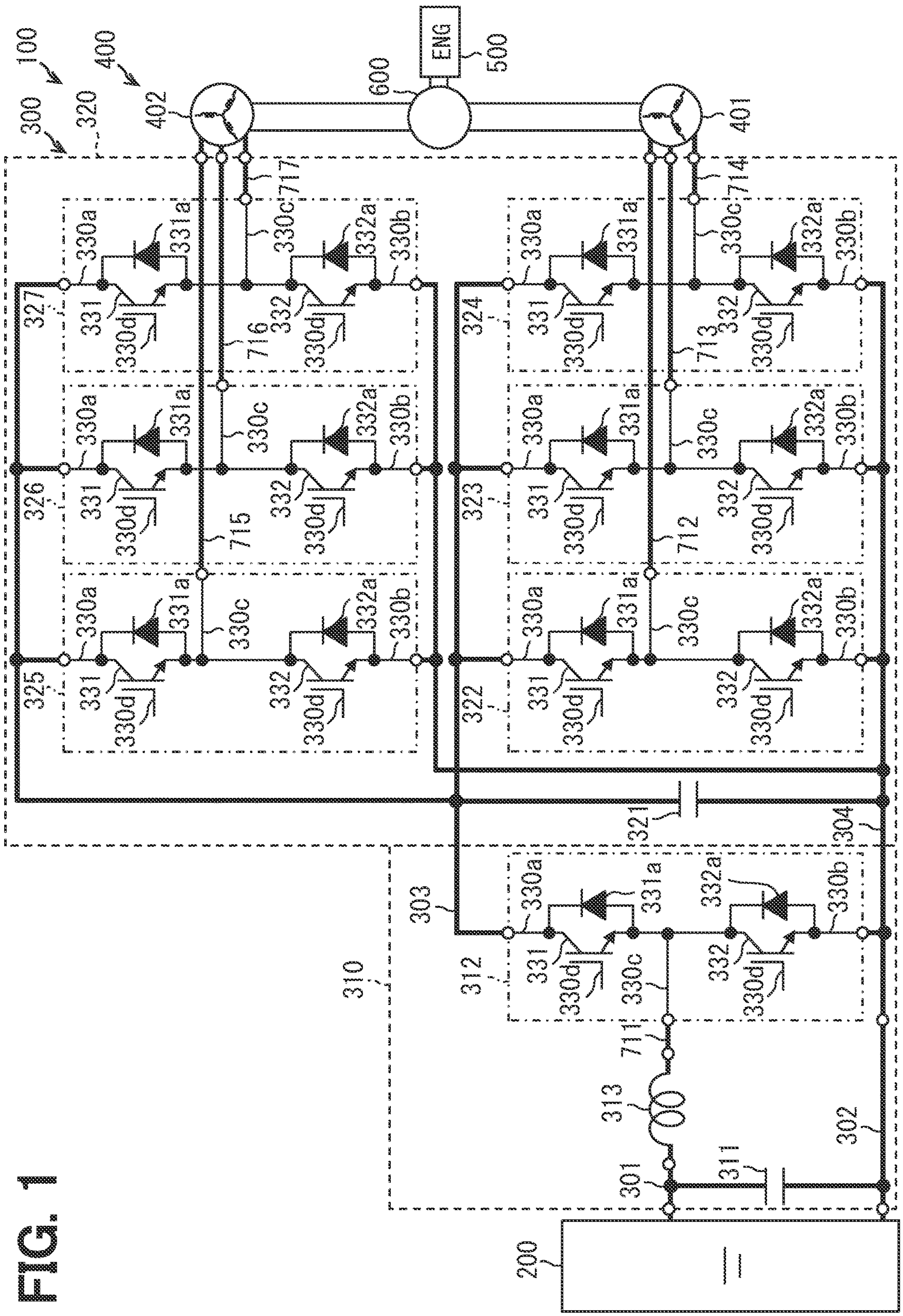
FIG. 1 is a circuit diagram illustrating an in-vehicle system.

A sensor unit disclosed may be used in a motor driven vehicles such as a hybrid vehicle or a battery powered vehicle. JP6350785B discloses an inverter device including a plurality of bus bars integrally molded in an insulating member and a plurality of current sensors provided in the insulating member in a manner facing each of the plurality of bus bars.

According to JP6350785B, there is a possibility that the relative positional relationship between the current sensor and the bus bar may be changed due to thermal expansion and contraction of the insulating member or the like. As a result, the magnetic field transmitted through the current sensor fluctuates, and the current detection accuracy may decrease.

It is an object of the present disclosure to provide a sensor unit in which a decrease in current detection accuracy is suppressed.

It should be noted that this disclosure in this specification describes the followings inventions (#1) to (#6).

(#1) A sensor unit, comprising: (i) a plurality of bus bars (711-717) arranged separately in the first predetermined direction, which are individually connected to each of a plurality of switch modules (312, 322-327) providing a part of a power conversion circuit; (ii) an insulating resin case (721) extending in the first predetermined direction, which connects the plurality of bus bars by embedding a part of each of the bus bars; (iii) a plurality of magnetic-electric conversion units (731-737) which are disposed in the resin case in a manner that the magnetic-electric conversion units face embedded portions (711*a*-717*a*) of the bus bars embedded in the resin case in a second predetermined direction intersecting the first predetermined direction and detect currents flowing through the bus bars by detecting a magnetic field generated by flow of current flowing through one of the bus bars, respectively; and (iv) a support body (770) which extends in the first predetermined direction and is connected to the resin case at two fixing points (725,774) separated in the first predetermined direction.

(#2) The sensor unit according to (#1), wherein the support body has a longer length in the second predetermined direction and has a higher rigidity than the resin case.

(#3) The sensor unit according to (#1) or (#2), wherein the support body includes: an insulating resin body (771,772); and a plurality of nuts (773) which are arranged apart from each other in the first predetermined direction, and are connected with the resin body in a manner of being partially embedded, wherein through holes (710*c*) are formed in exposed portions (710*b*) of the plurality of bus bars exposed from the resin case, and wherein the plurality of nuts and the plurality of bus bars are arranged to face each other in a manner that a bolt hole of the nut and the through hole are placed in a continuous manner.

(#4) The sensor unit according to any one of (#1)-(#3), further comprising: a plurality of front shields (741-747) which are embedded in the resin case in a manner arranged separately in the first predetermined direction, and suppress entering of external noise to each of the magnetic-electric conversion units.

(#5) The sensor unit according to (#4), further comprising: an insulating resin cover (750) fixed to the resin case; and a plurality of back shields (761-767) which are embedded in the resin cover in a manner arranged separately in the first predetermined direction, and suppress entering of external noise to each of the magnetic-electric conversion units, wherein the resin cover is fixed to the resin case so that a pair of the magnetic-electric conversion unit and the embedded portion is placed between one of the plurality of the front shields and one of the plurality of the back shields.

(#6) The sensor unit according to any one of (#1)-(#5), wherein each of the plurality of embedded portions has a shift portion (718) extending in the first predetermined direction, and wherein two of the shift portion of the embedded portion neighboring in the first predetermined direction are arranged separately in a third direction (y) orthogonal to each of the first predetermined direction (x) and the second predetermined direction (z).

The following will describe embodiments for carrying out the present disclosure with reference to the drawings. In each embodiment, parts corresponding to the elements described in the preceding embodiments are denoted by the same reference numerals, and redundant explanation may be omitted. When only a part of a configuration is described in an embodiment, another preceding embodiment may be applied to the other parts of the configuration.

When, in each embodiment, it is specifically described that combination of parts is possible, the parts can be combined. In a case where any obstacle does not especially occur in combining the parts of the respective embodiments, it is possible to partially combine the embodiments, the embodiment and the modification, or the modifications even when it is not explicitly described that combination is possible.

First Embodiment

In-vehicle System

First, an in-vehicle system 100 to which a sensor unit 700 is applied is described with reference to FIG. 1. The in-vehicle system 100 constitutes a hybrid system.

The in-vehicle system 100 includes a battery 200, a power conversion device 300, and a motor 400. Further, the in-vehicle system 100 includes an engine 500 and a power distribution mechanism 600. The power converter 300 includes a sensor unit 700. The motor 400 includes a first MG 401 and a second MG 402. MG is an abbreviation of a motor generator.

Further, the in-vehicle system 100 has a plurality of ECUs (not shown). The ECUs transmit signals to and receive signals from each other via a bus wiring. The ECUs cooperate with each other to control the hybrid vehicle. By the coordinated control of the ECUs, electric driving and electric generation (regeneration) of the motor 400 according to an SOC of the battery 200, an output of the engine 500, and the like are controlled. The SOC is an abbreviation of state of charge. ECU is an abbreviation of electronic control unit.

The ECU includes at least one calculation processing unit (also referred to as a CPU) and at least one memory device (also referred to as a MMR) as a storage medium storing a program and data. The ECU includes a microcontroller including a computer readable storage medium. The storage medium is a non-transitory tangible storage medium that non-temporally stores a computer readable program. The storage medium may include a semiconductor memory, a magnetic disk, or the like. Hereinafter, the components of the in-vehicle system 100 will be described individually.

The battery 200 includes a plurality of secondary batteries. The secondary batteries form a battery stack connected in series. As the secondary batteries, a lithium ion secondary battery, a nickel hydrogen secondary battery, an organic radical battery, or the like may be employed.

The secondary battery generates an electromotive voltage by chemical reaction. The secondary battery has a property that deterioration is accelerated when a charge amount is too large or too small. In other words, the secondary battery has a property that deterioration is accelerated when the SOC indicates over-charged or over-discharged.

The SOC of the battery 200 corresponds to a SOC of the battery stack described above. The SOC of the battery stack is the sum of the SOCs of the plurality of secondary batteries. Over-charging and over-discharging of the SOC of the battery stack is avoided by the above-mentioned cooperative control. On the other hand, over-charging and over-discharging of the SOCs of the plurality of secondary batteries are avoided by an equalization process for equalizing the SOCs of the plurality of secondary batteries.

The equalization process is performed by individually charging and discharging the plurality of secondary batteries. The battery 200 is provided with a monitoring unit including a switch for individually charging and discharging respective of the plurality of secondary batteries. Further, the battery 200 is provided with a voltage sensor, a temperature sensor, and the like for detecting the SOC of each of the plurality of secondary batteries. A battery ECU, which is one of the plurality of ECUs, controls opening and closing of the switch based on an output of these sensors and the like. In this way, the SOC of each of the plurality of secondary batteries is equalized. The output of the current sensor 730, which will be described later, is also used for SOC detection.

The power conversion device 300 performs power conversion between the battery 200 and the first MG 401. The power conversion device 300 further performs power conversion between the battery 200 and the second MG 402. The power conversion device 300 converts a DC power of the battery 200 into an AC power at a voltage level suitable for electric driving of the first MG 401 and the second MG 402. The power conversion device 300 converts the AC power generated by power generation of the first MG 401 and the second MG 402 into a DC power at a voltage level suitable for charging the battery 200. The power conversion device 300 will be described in detail later.

The first MG 401, the second MG 402, and the engine 500 are each connected to the power distribution mechanism 600. The first MG 401 generates electricity by a rotational energy supplied from the engine 500. The AC power generated by this power generation is converted into a DC power and is stepped down by the power conversion device 300. This DC power is supplied to the battery 200. The DC power is also supplied to various electric loads mounted on the electric vehicle.

The second MG 402 is connected to an output shaft of the hybrid vehicle. A rotational energy of the second MG 402 is transmitted to a traveling wheel via the output shaft. On the contrary, rotational energy of the traveling wheel is transmitted to the second MG 402 via the output shaft.

The second MG 402 is electrically driven by an AC power supplied from the power conversion device 300. The rotational energy generated by this electric driving is distributed to the engine 500 and the traveling wheels by the power distribution mechanism 600. In this way, cranking of the crankshaft is performed, and a propulsive force is applied to the traveling wheels. Further, the second MG 402 is regenerated by a rotational energy transmitted from the traveling wheel. An AC power generated by this regeneration is converted into a DC power and is stepped down by the power conversion device 300. This DC power is supplied to the battery 200 and various electric loads.

The rated current of the second MG 402 is larger than that of the first MG 401. A larger amount of current is more likely to flow in the second MG 402 than in the first MG 401.

The engine 500 generates a rotational energy by combustion of fuel. This rotational energy is distributed to the first MG 401 and the second MG 402 via the power distribution mechanism 600. In this way, the power generation of the first MG 401 is implemented, and the propulsive force is applied to the traveling wheels.

The power distribution mechanism 600 includes a planetary gear mechanism. The power distribution mechanism 600 includes a sun gear, planetary gears, a planetary carrier, and a ring gear.

Each of the sun gear and the planetary gear is in a disk shape. A plurality of teeth are formed side by side in the circumferential direction on the circumferential surface of each of the sun gear and the planetary gear.

The planetary carriers is in a ring shape. A plurality of planetary gears are connected to a flat surface of the planetary carrier in such a manner that the flat surface of the planetary carrier and the planetary gears face each other.

The plurality of planetary gears are located on a circumference centered on a center of rotation of the planetary carrier. The planetary gears, which are adjacent to each other, are at a constant distance. In this embodiment, three planetary gears are arranged at 120 degrees intervals.

The ring gear is in an annular shape. A plurality of teeth are formed side by side in the circumferential direction on each of an outer peripheral surface and an inner peripheral surface of the ring gear.

The sun gear is provided at the center of the ring gear. The outer peripheral surface of the sun gear and the inner peripheral surface of the ring gear face each other. Three planetary gears are provided between the sun gear and the ring gear. The teeth of each of the three planetary gears mesh with the teeth of the sun gear and the teeth of the ring gear. In this configuration, rotations of the sun gear, rotations of the planetary gear, rotations of the planetary carrier, and rotations of the ring gear can be transmitted to each other.

A motor shaft of the first MG401 is connected to the sun gear. The crankshaft of the engine 500 is connected to the planetary carrier. A motor shaft of the second MG 402 is connected to the ring gear. In this configuration, a rotation speed of the first MG 401, a rotation speed of the engine 500, and a rotation speed of the second MG 402 are in a linear relationship in a collinear diagram.

By supplying an AC power from the power conversion device 300 to the first MG 401 and the second MG 402, torque is generated in the sun gear and the ring gear. Torque is generated in the planetary carrier by combustion of the engine 500. In this configuration, power generation of the first MG 401, electric driving and regeneration of the second MG 402, and application of the propulsive force to the traveling wheels are performed.

For example, the MGECU, which is one of the above-mentioned plurality of ECUs, determines a target torque of the first MG 401 and a target torque of the second MG 402 based on physical quantities detected by using various sensors mounted on the hybrid vehicle, vehicle information input from another ECU, and the like. The MG ECU implements a vector-control, such that the torque generated in each of the first MG 401 and the second MG 402 becomes the target torque. This MGECU is mounted on the control circuit board.

Circuit Configuration of Power Conversion Device

Next, the power conversion device 300 will be described. As shown in FIG. 1, the power conversion device 300 includes a converter 310 and an inverter 320 as components of the power conversion circuit. The converter 310 functions to raise or lower a voltage level of DC power. The inverter 320 functions to convert a DC power into an AC power. The inverter 320 functions to convert an AC power into a DC power.

The converter 310 boosts the DC power of the battery 200 to a voltage level suitable for torque generation of the first MG 401 and the second MG 402. The inverter 320 converts the DC power into an AC power. This AC power is supplied to the first MG401 and the second MG402. Further, the inverter 320 converts the AC power generated by the first MG 401 and the second MG 402 into a DC power. The converter 310 steps down the DC power to a voltage level suitable for charging the battery 200.

As shown in FIG. 1, the converter 310 is electrically connected to the battery 200 via a positive electrode bus bar 301 and a negative electrode bus bar 302. Further, the converter 310 is electrically connected to the inverter 320 via a P bus bar 303 and a N bus bar 304.

Converter

The converter 310 includes, as electric elements, a filter capacitor 311, an A-phase switch module 312, and an A-phase reactor 313.

As shown in FIG. 1, one end of the positive electrode bus bar 301 is connected to the positive electrode of the battery 200. One end of the negative electrode bus bar 302 is connected to the negative electrode of the battery 200. One of the two electrodes of the filter capacitor 311 is connected to the positive electrode bus bar 301. The other of the two electrodes of the filter capacitor 311 is connected to the negative electrode bus bar 302.

One end of the A-phase reactor 313 is connected to the positive electrode bus bar 301. The other end of the A-phase reactor 313 is connected to the A-phase switch module 312 via the first connection bus bar 711. As a result, the positive electrode of the battery 200 and the A-phase switch module 312 are electrically connected via the A-phase reactor 313 and the first connection bus bar 711. In FIG. 1, connection portions of several bus bars are indicated by white circles. These connection portion are electrically connected by, for example, bolts or welding.

The A-phase switch module 312 includes a high-side switch 331 and a low-side switch 332. Further, the A-phase switch module 312 includes a high-side diode 331*a* and a low-side diode 332*a*. These semiconductor elements are embedded and protected by a sealing resin (not shown).

In this embodiment, an n-channel type IGBT is employed as each of the high-side switch 331 and the low-side switch 332. Tip ends of terminals, which are connected to the collector electrodes, the emitter electrodes, and the gate electrodes of the high-side switch 331 and the low-side switch 332, are exposed to the outside of the sealing resin.

As shown in FIG. 1, an emitter electrode of the high-side switch 331 and a collector electrode of the low-side switch 332 are connected to each other. In this configuration, the high-side switch 331 and the low-side switch 332 are connected in series.

Further, a cathode electrode of the high-side diode 331*a* is connected to a collector electrode of the high-side switch 331. An anode electrode of the high-side diode 331*a* is connected to an emitter electrode of the high-side switch 331. In this configuration, the high-side diode 331*a* is connected in anti-parallel to the high-side switch 331.

Similarly, a cathode electrode of the low-side diode 332*a* is connected to a collector electrode of the low-side switch 332. An anode electrode of the low-side diode 332*a* is connected to an emitter electrode of the low-side switch 332. In this configuration, the low-side diode 332a is connected in anti-parallel to the low-side switch 332.

As described above, the high-side switch 331 and the low-side switch 332 are covered and protected by the sealing resin. Tip ends of terminals, which are connected to the collector electrode and the gate electrode of the high-side switch 331, an intermediate point between the high-side switch 331 and the low-side switch 332, and the emitter electrode and the gate electrode of the low-side switch 332, are exposed from this sealing resin. In the following, these terminals are referred to as a collector terminal 330*a*, a intermediate point terminal 330*c*, an emitter terminal 330*b*, and a gate terminal 330*d*.

The collector terminal 330*a* is connected to the P bus bar 303. The emitter terminal 330*b* is connected to the N bus bar 304. In this configuration, the high-side switch 331 and the low-side switch 332 are sequentially connected in series from the P bus bar 303 to the N bus bar 304.

Further, the intermediate point terminal 330*c* is connected to the first connection bus bar 711. The first connection bus bar 711 is electrically connected to the positive electrode of the battery 200 via the A-phase reactor 313 and the positive electrode bus bar 301.

In the configuration described above, an DC power of the battery 200 is supplied to the intermediate point of the two switches included in the A-phase switch module 312 via the positive electrode bus bar 301, the A-phase reactor 313, and the first connection bus bar 711. An AC power of the motor 400, which is converted into a DC power by the inverter 320, is supplied to the collector electrode of the high-side switch 331 of the A-phase switch module 312. The AC power of the motor 400 converted into the DC power is supplied to the battery 200 via the high side switch 331, the first connection bus bar 711, the A-phase reactor 313, and the positive electrode bus bar 301.

In this way, DC power for inputting/outputting the battery 200 flows through the first connection bus bar 711. Limiting the physical quantity flowing therethrough, direct current inputting to and/or outputting from the battery 200 flows through the first connection bus bar 711.

A gate driver is connected to the gate terminals 330*d* of the high-side switch 331 and the low-side switch 332, respectively. The MGECU generates a control signal and outputs the control signal to the gate driver. The gate driver amplifies the control signal and outputs the control signal to the gate terminal 330*d*. In this configuration, the high-side switch 331 and the low-side switch 332 are controlled to open and close by the MGECU. In this way, the voltage level of the DC power input to the converter 310 is stepped up and down.

The MGECU generates a pulse signal as the control signal. The MGECU adjusts a step-up/down level of the DC power by adjusting an on-duty ratio and a frequency of the pulse signal. This step-up/down level is determined according to the target torque of the motor 400 and the SOC of the battery 200.

When boosting the DC power of the battery 200, the MGECU alternately opens and closes the high-side switch 331 and the low-side switch 332. On the contrary, when steeping down the DC power supplied from the inverter 320, the MGECU fixes the control signal output to the low-side switch 332 to a low level. At the same time, the MGECU sequentially switches the control signal output to the high-side switch 331 between a high level and a low level.

Inverter

The inverter 320 includes, as electric elements, a smoothing capacitor 321, a discharge resistor (not shown), and a U-phase switch module 322 to a Z-phase switch module 327.

One of the two electrodes of the smoothing capacitor 321 is connected to the P bus bar 303. The other of the two electrodes of the smoothing capacitor 321 is connected to the N bus bar 304. The discharge resistor is also connected to the P bus bar 303 and the N bus bar 304. The U-phase switch module 322 to the Z-phase switch module 327 are also connected to the P bus bar 303 and the N bus bar 304. The smoothing capacitor 321, the discharge resistor, and the U-phase switch module 322 to the Z-phase switch module 327 are connected in parallel between the P bus bar 303 and the N bus bar 304.

Each of the U-phase switch module 322 to the Z-phase switch module 327 includes components equivalent to those of the A-phase switch module 312. That is, each of the U-phase switch module 322 to the Z-phase switch module 327 includes the high-side switch 331, the low-side switch 332, the high-side diode 331*a*, the low-side diode 332*a*, and the sealing resin. Each of these 6-phase switch modules includes the collector terminal 330*a*, the emitter terminal 330*b*, the intermediate point terminal 330*c*, and the gate terminal 330*d*.

The collector terminal 330*a* of each of these 6-phase switch modules is connected to the P bus bar 303. The emitter terminal 330*b* is connected to the N bus bar 304.

The intermediate point terminal 330*c* of the U-phase switch module 322 is connected to a U-phase stator coil of the first MG 401 via the second connection bus bar 712. The intermediate point terminal 330*c* of the V-phase switch module 323 is connected to a V-phase stator coil of the first MG 401 via the third connection bus bar 713. The intermediate point terminal 330*c* of the W-phase switch module 324 is connected to a W-phase stator coil of the first MG 401 via the fourth connection bus bar 714.

Similarly, the intermediate point terminal 330*c* of the X-phase switch module 325 is connected to an X-phase stator coil of the second MG 402 via the fifth connection bus bar 715. The intermediate point terminal 330*c* of the Y-phase switch module 326 is connected to a Y-phase stator coil of the second MG 402 via the sixth connection bus bar 716. The intermediate point terminal 330*c* of the Z-phase switch module 327 is connected to the Z-phase stator coil of the second MG 402 via the seventh connection bus bar 717.

The gate terminal 330*d* of each of these 6-phase switch modules is connected to the above-described gate driver. When each of the first MG 401 and the second MG 402 is electrically driven, the high-side switches 331 and the low-side switches 332 included in the 6-phase switch module are PWM controlled by the output of the control signal from the MG ECU. In this way, three-phase alternating current is generated in the inverter 320. When each of the first MG 401 and the second MG 402 generates (regenerates), the MG ECU, for example, stops the output of the control signal. In this way, the AC power generated by the power generation passes through the diodes provided in the 6-phase switch module. As a result, the AC power is converted to DC power.

As described above, the AC power input/output to and from each of the first MG 401 and the second MG 402 flows through the second connection bus bar 712 to the seventh connection bus bar 717 that connect each of the first MG 401 and the second MG 402 to the inverter 320. Limiting the physical quantity flowing therethrough, AC power inputting to and/or outputting from either one of the first MG401 and the second MG402 flows through the second connection bus bar 712 to the seventh connection bus bar 717.

Available types of the switch element provided in each of the A-phase switch module 312 and the U-phase switch module 322 to the Z-phase switch module 327 are not particularly limited, and may be MOSFETs, for example. The semiconductor elements such as the switches and the diodes included in these switch modules may be formed of a semiconductor such as Si and may be formed of a wide-gap semiconductor such as SiC. A material of the semiconductors element is not particularly limited.

Mechanical Configuration of Power Conversion Device

The mechanical configuration of the power conversion device 300 is described. Three directions orthogonal to one another are referred to as an x-direction, a y-direction, and a z-direction. In the drawings, the description of "direction" is omitted, and the description is simply x, y, z. The x-direction corresponds to a first predetermined direction. The y-direction corresponds to a third predetermined direction. The z-direction corresponds to a second predetermined direction.

Figure 2:
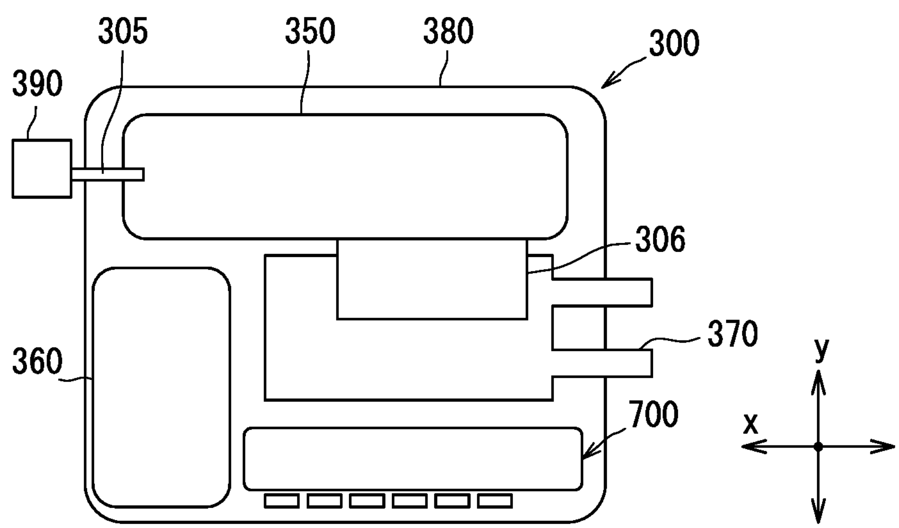
FIG. 2 is a schematic diagram illustrating a power conversion device.

In addition to the components of the power conversion circuit described above, the power conversion device 300 includes a capacitor case 350, a reactor case 360, a cooler 370, a sensor unit 700, an inverter housing 380, and an input/output connector 390 shown in FIG. 2.

In FIG. 2, the positive electrode bus bar 301 and the negative electrode bus bar 302 are collectively shown as an electrode bus bar 305. The ends of these two bus bars are provided on the input/output connector 390. Terminals of the wire harness are connected to the input/output connector 390. The battery 200 and the power conversion device 300 are electrically connected via a wire harness.

Further, in FIG. 2, the P bus bar 303 and the N bus bar 304 are collectively shown as a PN bus bar 306. These two bus bars are arranged in a laminated manner in the z-direction via an insulating sheet.

Each of the capacitor case 350 and the reactor case 360 is made of an insulating resin material. The filter capacitor 311 and the smoothing capacitor 321 are accommodated in the capacitor case 350. The A-phase reactor 313 is accommodated in the reactor case 360.

The cooler 370 accommodates the switch modules included in the converter 310 and the inverter 320. The cooler 370 serves a function to cool the plurality of switch modules. A power module is configured by accommodating a plurality of switch modules in the cooler 370.

The sensor unit 700 includes a terminal block 720 formed of an insulating resin material. The above-described first connection bus bar 711 to the seventh connection bus bar 717 are insert-molded in this terminal block 720. The terminal block 720 is provided with the current sensor 730 which detect current flowing through the plurality of connection bus bars. The sensor unit 700 is described in detail later.

The inverter housing 380 houses the capacitor case 350, the reactor case 360, the cooler 370, the sensor unit 700, and the input/output connector 390, respectively. The inverter housing 380 also accommodates the electrode bus bar 305 and the PN bus bar 306.

Although not shown, the inverter housing 380 is connected to a motor housing which accommodates the first MG 401 and the second MG 402, respectively. By connecting the power conversion device 300 and the motor 400, a so-called mechanical/electrical integrated power conversion unit is configured.

The inverter housing 380 and the motor housing are connected in a parallel manner in the z-direction. A part of the PN bus bar 306 is arranged to the cooler 370, which accommodates a plurality of switch modules, in a facing manner in the z-direction.

As described above, a total of seven switch modules included in the converter 310 and the inverter 320 are accommodated in the cooler 370. These switch modules have a sealing resin, and the tips of the collector terminal 330*a*, the emitter terminal 330*b*, the intermediate point terminal 330*c*, and the gate terminal 330*d* are exposed from the sealing resin. Of these four terminals, the collector terminal 330*a*, the emitter terminal 330*b*, and the intermediate point terminal 330*c* each extend in the z-direction toward the PN bus bar 306. The gate terminal 330*d* extends in the z-direction opposite to these three terminals.

The collector terminal 330*a* is welded to the P bus bar 303. The emitter terminal 330*b* is connected to the N bus bar 304. The intermediate point terminal 330*c* is welded to the connecting bus bar included in the sensor unit 700.

Although not shown, the inverter housing 380 houses a driver board having the gate driver and a control circuit board having the MGECU. These driver board and the control circuit board are lined up with the PN bus bar 306 in the z-direction via the cooler 370. The gate terminal 330*d* is soldered to this driver board. Output pins 723*a*, which are described later, are soldered to the control circuit board. The driver board and the control circuit board are electrically connected via wires.

Sensor Unit

Next, the sensor unit 700 is described in detail with reference to FIGS. 2 to 9. The sensor unit 700 includes the first connection bus bar 711 to the seventh connection bus bar 717, the terminal block 720, and the current sensor 730 described above. Further, the sensor unit 700 has a front shield 740, a resin cover 750, and a back shield 760 as shown in FIG. 6. The front shield 740 may be referred to as a shielding shield or covering shield. The back shield 760 may be referred to as an opposite shield or facing shield. Further, the sensor unit 700 has a nut box 770 shown in FIGS. 7 to 9. The nut box 770 corresponds to a support body.

Corresponding to the above-mentioned seven connection bus bars, the current sensor 730 has a first magnetic-electric conversion unit 731 to a seventh magnetic-electric conversion unit 737, which are a magnetic equilibrium type, and a sensor substrate 738 on which these seven magnetic-electric conversion units are mounted. Hereinafter, a magnetic-electric conversion unit may be referred to as a MEC unit. The front shield 740 has a first front shield 741 to a seventh front shield 747 made of a metal material having a higher magnetic permeability than the terminal block 720. The back shield 760 has a first back shield 761 to a seventh back shield 767 made of a metal material having a higher magnetic permeability than the resin cover 750.

Each of the first connection bus bar 711 to the seventh connection bus bar 717 is insert-molded into the terminal block 720. The first MEC unit 731 to the seventh MEC unit 737 are provided in the terminal block 720 in a manner facing seven pieces of portions of the seven connection bus bars, which is insert molded in the terminal block 720, in the z-direction.

The first front shield 741 to the seventh front shield 747 are insert-molded in the terminal block 720. The first back shield 761 to the seventh back shield 767 are insert-molded in the resin cover 750. The resin cover 750 is provided on the terminal block 720 in such a manner that the seven front shields and the seven back shields are arranged so as to be separated from each other in the z-direction.

One portion of the connection bus bar insert molded in the terminal block 720 and one MEC unit are located between one front shield and one back shield arranged in the z-direction. As a result, entering of an external noise to the MEC unit is suppressed. Distribution of the magnetic field (magnetic field to be measured) generated from a current flowing through an insert-molded portion of the terminal block 720 in the connection bus bar is regulated. Directional fluctuations of the magnetic field to be measured passing through the MEC unit are suppressed.

The nut box 770 has a first resin body 771 and a second resin body 772, and seven nuts 773 partially embedded therein. The first resin body 771 and the second resin body 772 are connected to the terminal block 720. The seven nuts 773 serve to perform functions to bolt each of the first connection bus bar 711 to the seventh connection bus bar 717 to the inner bus bar and the outer bus bar described later. Hereinafter, the components of the sensor unit 700 are described.

Connection Bus Bar

The first connection bus bar 711 to the seventh connection bus bar 717 are made of a metal material such as copper or aluminum, which has a higher rigidity than the terminal block 720. These seven bus bars are manufactured by press forming of a flat metal plate. The central portions of the seven connection bus bars are insert-molded into the terminal block 720. Both ends of the seven connecting bus bars are exposed from the terminal block 720.

The intermediate point terminal 330*c* of the switch module is joined to one end 710*a* of the first connection bus bar 711 to the seventh connection bus bar 717 exposed from the terminal block 720. Seven nuts 773 are individually arranged to face the other ends 710*b* of the first connection bus bar 711 to the seventh connection bus bar 717, respectively. The inner bus bar is bolted to the other end 710*b* of the first connection bus bar 711 and one nut 773. The inner bus bar is connected to the A-phase reactor 313. Six outer bus bars are bolted to the other ends 710*b* of the second connection bus bar 712 to the seventh connection bus bar 717 and the six nuts 773, respectively. The outer bus bar is connected to the stator coil of the motor 400 via a wire harness. The other end 710*b* corresponds to an exposed portion.

Terminal Block

The terminal block 720 has a base 721, a flange portion 722, and a connector portion 723, in detail. The base 721, the flange portion 722, and the connector portion 723 are integrally connected by a resin material constituting the terminal block 720. The base 721 corresponds to a resin case.

The base 721 has a substantially rectangular parallelepiped shape with the x-direction as the longitudinal direction. Therefore, the base 721 has a left surface 721*a* and a right surface 721*b* parallel in the x-direction, a front surface 721*c* and a rear surface 721*d* parallel in the y-direction, and an upper surface 721*e* and a lower surface 721*f* parallel in the z-direction.

As shown in FIGS. 3 to 6, flange portions 722 are integrally formed on the left surface 721*a* and the right surface 721*b* of the base 721, respectively. One of these two flange portions 722 projects in the x-direction in a manner that it is separated from the left surface 721*a*. The other of the two flange portions 722 projects in the x-direction in a manner that it is separated from the left surface 721*b*.

these two flange portions 722 include insert-molded metal collars 722*a*, respectively. The collar 722*a* is in an annular shape and opens in the z-direction. Bolts can be placed to pass through the collar 722*a*. The tip end side of the bolt is fastened to the inverter housing 380. As a result, the sensor unit 700 is fixed to the inverter housing 380.

Figure 3:
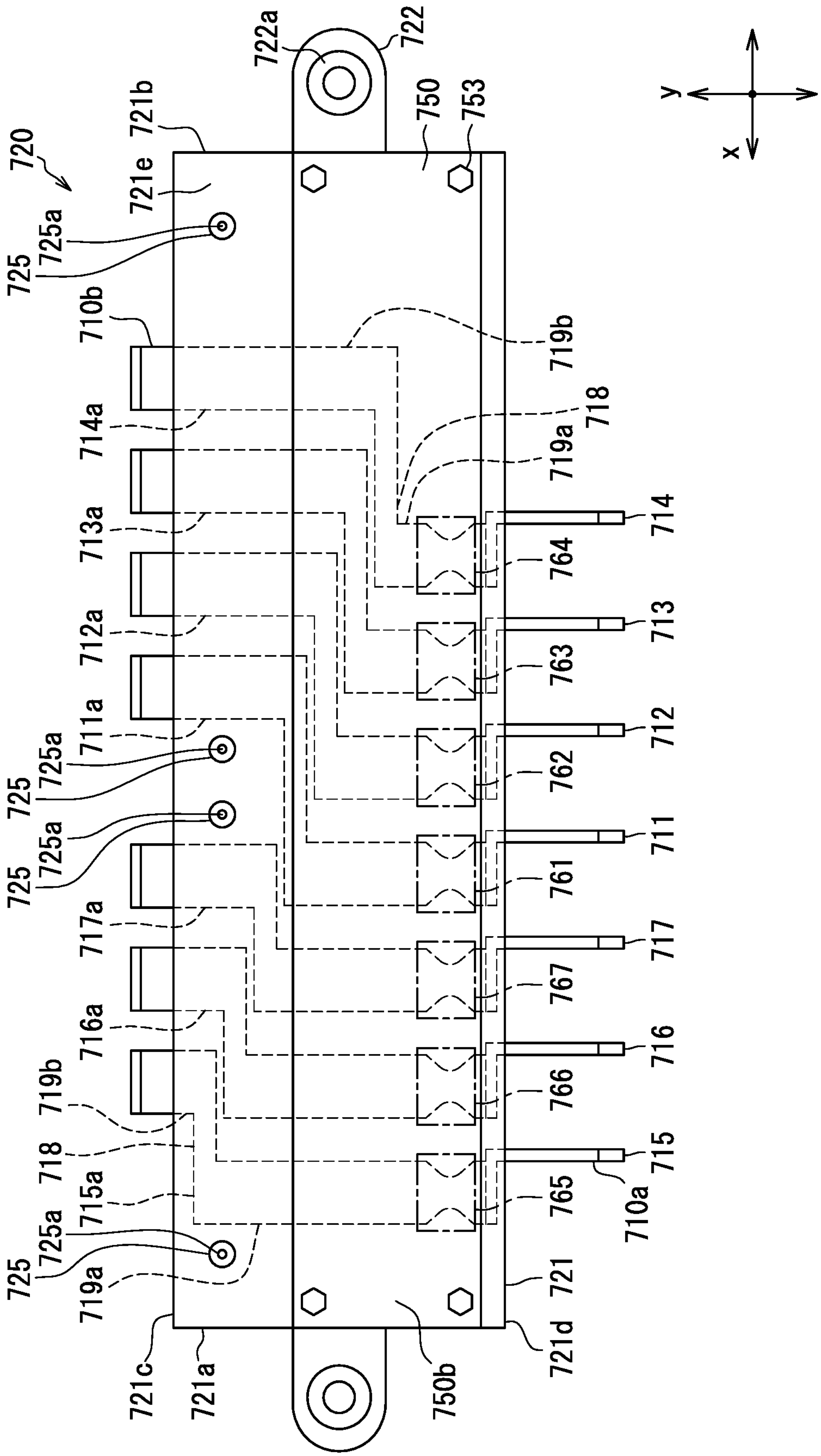
FIG. 3 is a top view of the sensor unit excluding a nut box.
Figure 5:
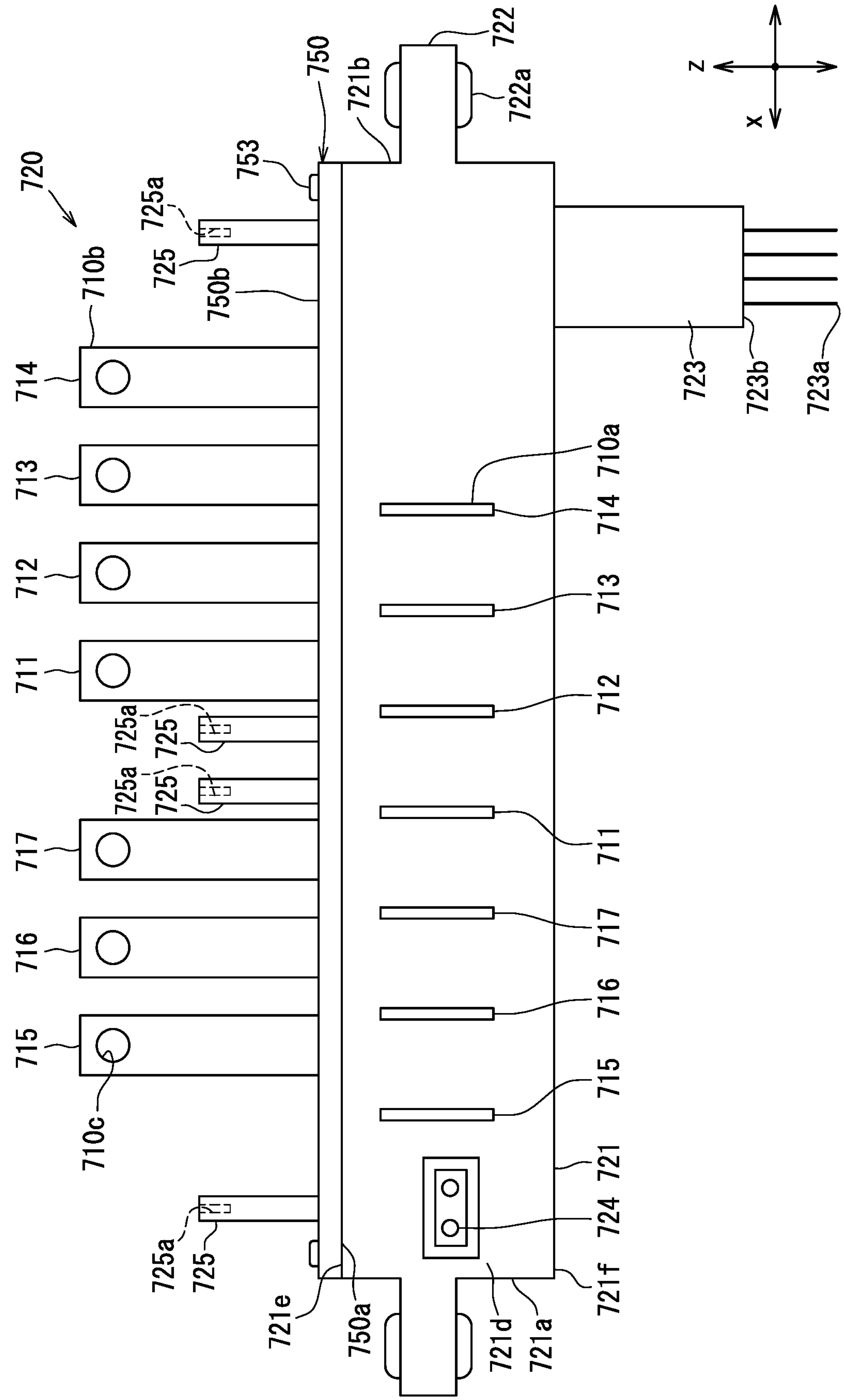
FIG. 5 is a back view of the sensor unit excluding a nut box.
Figure 6:
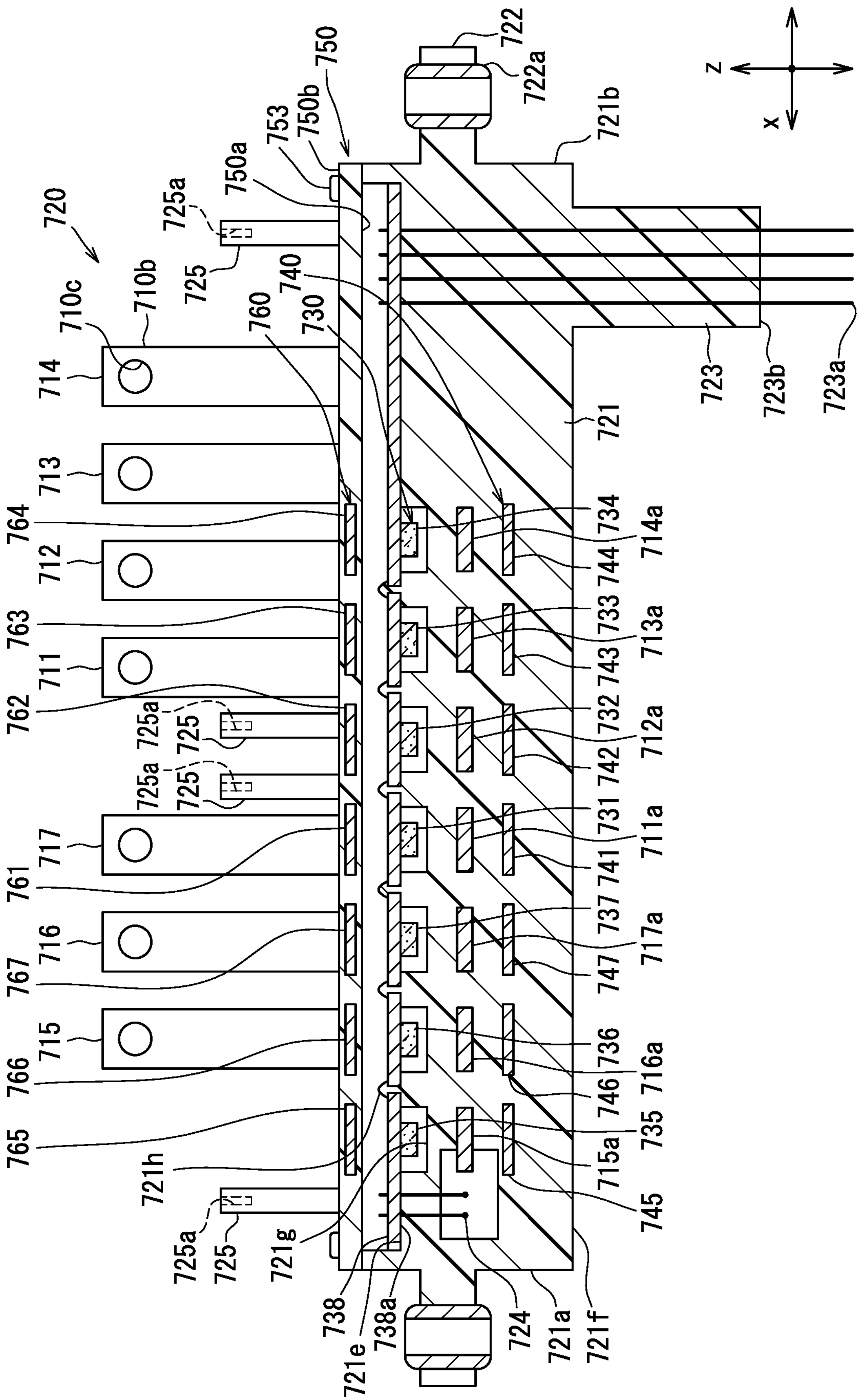
FIG. 6 is a cross-sectional view on a line VI-VI in FIG. 4.
Figure 7:
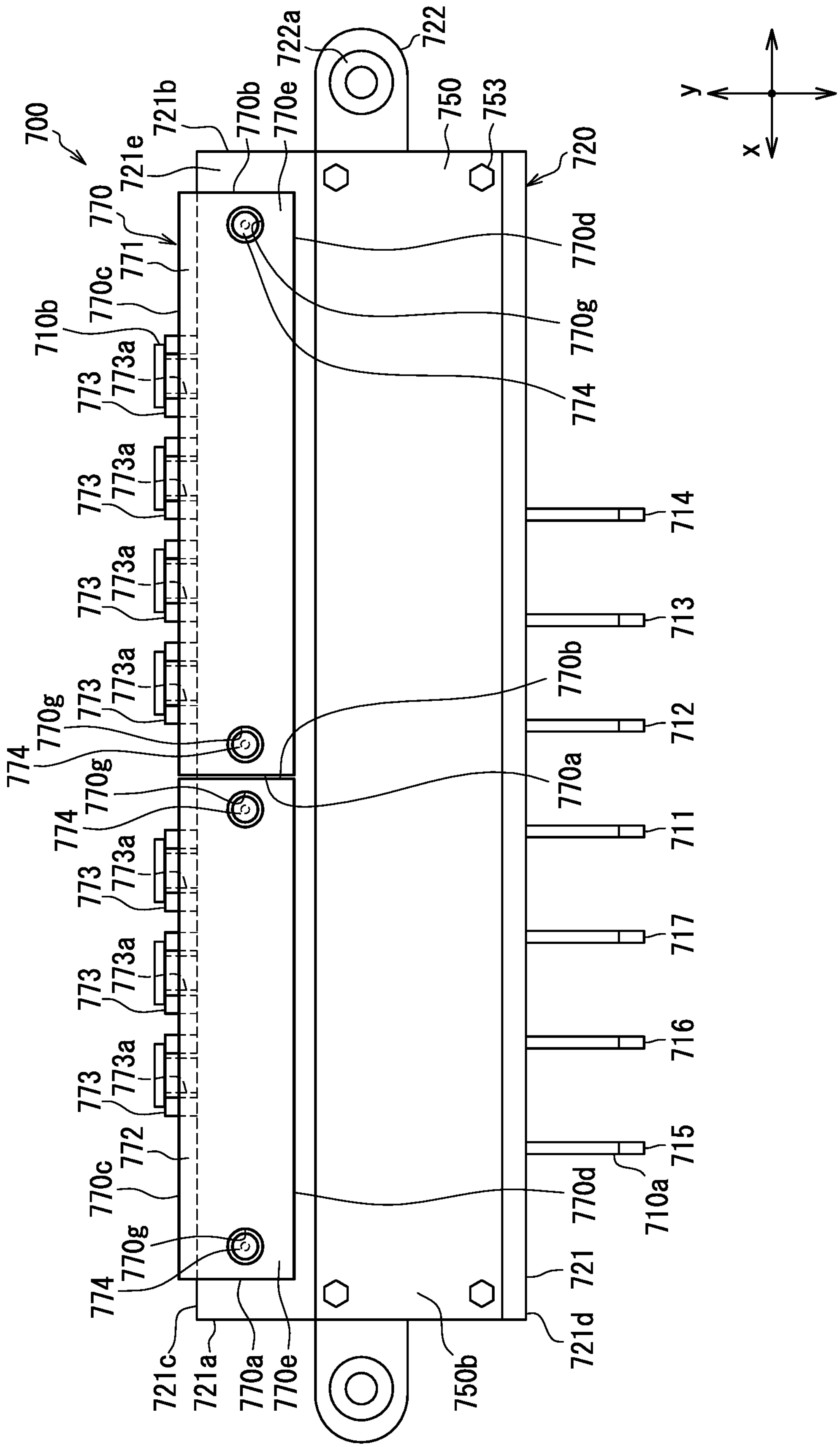
FIG. 7 is a top view of the sensor unit.
Figure 9:
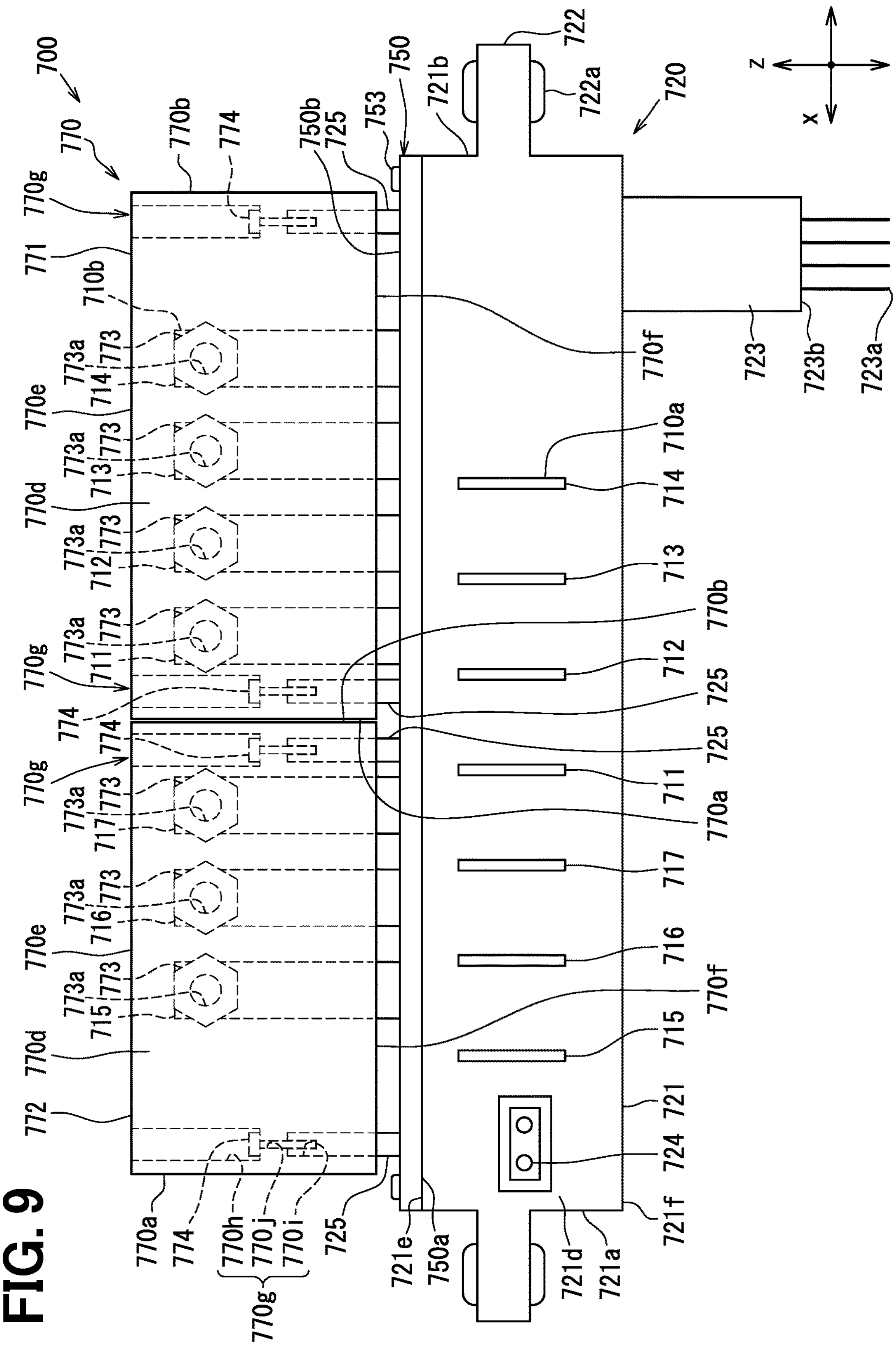
FIG. 9 is a back view of the sensor unit.

As shown in FIGS. 3 and 5, a plurality of pillar portions 725 are formed on the upper surface 721*e* of the base 721. The pillar portion 725 extends in the z-direction in a manner that it is separated from the upper surface 721*e*. As shown in FIGS. 7 and 9, the first resin body 771 and the second resin body 772 are connected to these plurality of pillar portions 725.

Figure 4:
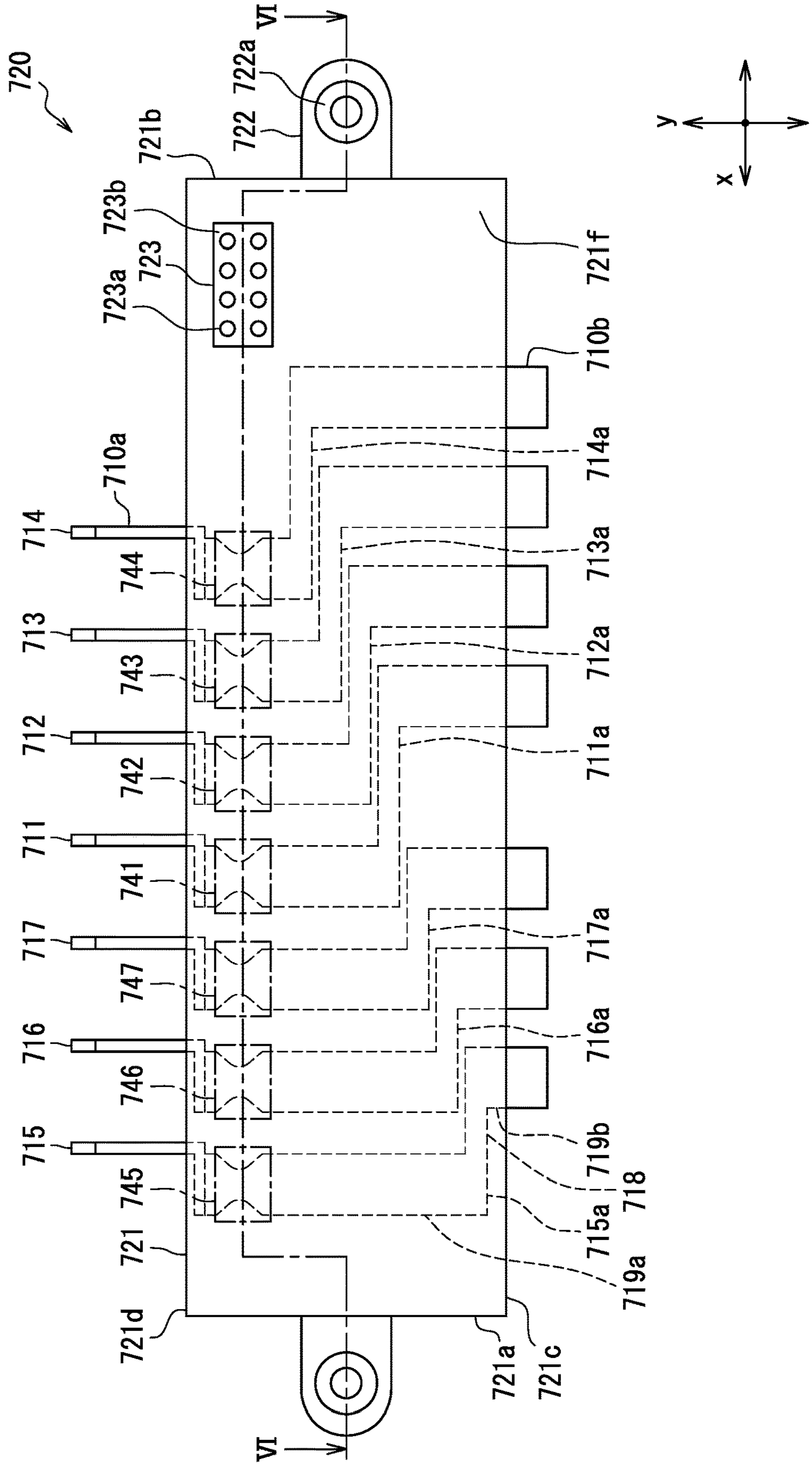
FIG. 4 is a bottom view of the sensor unit excluding a nut box.

As shown in FIGS. 4 and 5, the connector portion 723 is integrally connected to the lower surface 721*f* of the base 721. The connector portion 723 extends in the z-direction in a manner that it is separated from the lower surface 721*f*.

A plurality of output pins 723*a* are insert-molded in the connector portion 723. The output pin 723*a* extends in the z-direction. One end of the output pin 723*a* is exposed from the tip surface 723*b* of the connector portion 723. One end of the output pin 723*a* is soldered to the control circuit board. The other end of the output pin 723*a* is exposed from the upper surface 721*e* of the base 721. The other end of the output pin 723*a* is soldered to the sensor board 738.

As shown in FIGS. 3 to 5, the central portions of the first connection bus bar 711 to the seventh connection bus bar 717 are insert-molded in the base 721. These seven connecting bus bars are arranged so as to be separated from each other in the x-direction. Specifically, from the left surface 721*a* to the right surface 721*b*, the fifth connection bus bar 715, the sixth connection bus bar 716, the seventh connection bus bar 717, the first connection bus bar 711, the second connection bus bar 712, the third connection bus bar 713, and the fourth connection bus bar 714 are arranged in this order.

One ends 710*a* of these seven connection bus bars protrude from the rear surface 721*d*. One end 710*a* has a thin flat shape with a thickness in the x-direction. The connecting surface of the one end 710*a* facing in the x-direction and the intermediate point terminal 330*c* are arranged to come into contact in a facing manner in the x-direction. A laser is applied to the one end 710*a* and the intermediate point terminal 330*c* from the z-direction. As a result, the connection bus bar and the intermediate point terminal 330*c* are welded together.

The other ends 710*b* of these seven connection bus bars protrude from the front surface 721*c*. The other end 710*b* extends in the y-direction in a manner that it is separated from the front surface 721*c*, then bends and extends from the lower surface 721*f* toward the upper surface 721*e* in the z-direction. The other end 710*b* may extend from the upper surface 721*e* toward the lower surface 721*f* in the z-direction.

As shown in FIG. 7, the portion extending in the z-direction at the other end 710*b* and the nut box 770 are arranged to face each other in the y-direction. That is, the other ends 710*b* of the seven connection bus bars and the seven nuts 773 provided in the nut box 770 are individually arranged to face each other in the y-direction, respectively.

The portion extending in the z-direction at the other end 710*b* forms a flat shape having a thin thickness in the y-direction. A through hole 710*c* penetrating in y-direction is formed in the other end 710*b*. The nut 773 is formed with a bolt hole 773*a* that opens in the y-direction. These through hole 710*c* and the bolt hole 773*a* are placed continuous in the y-direction.

Further, ends of one inner bus bar and six outer bus bars (not shown) are arranged to face each of the seven other ends 710*b* in the y-direction, respectively. At the ends of these seven bus bars, through holes having the same shape as the through holes 710*c* are formed. The through hole of the bus bar, the through hole 710*c* of the connection bus bar, and the bolt hole 773*a* of the nut 773 are arranged in this order in the y-direction to form a single hole.

A shaft portion of the fixing bolt 774 is inserted into this hole, and a tip end side thereof is fastened to the bolt hole 773*a*. As a result, one inner bus bar and six outer bus bars are mechanically and electrically connected to the seven connection bus bars, respectively.

The central portion of each of the first connection bus bar 711 to the seventh connection bus bar 717 insert-molded into the base 721 extends from the rear surface 721*d* toward the front surface 721*c* and then extends from the left surface 721*a* toward the right surface 721*b*. The central portion extends toward the front surface 721*c*.

In the following, in order to simplify the notation, portions (central portions) of the first connection bus bar 711 to the seventh connection bus bar 717 inserted into the terminal block 720 may be referred to a first embedded portion 711*a* to the seventh embedded portion 717*a*. Portions of these embedded portions shifting certain distances toward the left surface 721*a* to the right surface 721*b* is referred to as a shift portions 718. Portions of the embedded portions extending from the shift portions 718 toward the rear surface 721*d* are referred to as first extension portions 719*a*. The first extension portion 719*a* may be referred to as an elongated portion or an longitudinal extending portion. Portions of the embedded portions extending from the shift portions 718 toward the front surface 721*c* are referred to as second extension portions 719*b*. The second extension portion 719*a* may be referred to as an elongated portion or an longitudinally extending portion.

As shown in FIGS. 3 and 4, the shift portion 718 extends from the left surface 721*a* toward the right surface 721*b* along the x-direction. The first extension portion 719*a* extends along the y-direction from an end portion of the shift portion 718 on the left surface 721*a* side toward one end 710*a* side. The second extension portion 719*b* extends along the y-direction from an end portion of the shift portion 718 on the right surface 721*b* side toward the other end 710*b* side.

Lengths of the first extension portions 719*a* of the first embedded portion 711*a* to the seventh embedded portion 717*a* in the y-direction are different. Similarly, lengths of the second extension portions 719*b* of these seven embedded portions in the y-direction are also different. However, the total length of the first extension portion 719*a* and the second extension portion 719*b* in the y-direction of each of the seven embedded portions are the same.

As shown in FIGS. 5 and 6, an interlock pin 724 is insert-molded in the base 721. The interlock pin 724 can be used to determine whether a protective cover (not shown) is attached to the sensor unit 700 or not.

One end of the interlock pin 724 projects from the rear surface 721*d* of the base 721. Connection pin of the protective cover is connected to the one end. The other end of the interlock pin 724 projects from the upper surface 721*e* of the base 721. The other end is connected to the sensor board 738. A signal indicating a connection state between the interlock pin 724 and the connection pin is input to the MGECU of the control circuit board via the sensor board 738 and the output pin 723*a* as a signal indicating an attachment state of the protective cover and the sensor unit 700.

As shown in FIG. 6, a plurality of recesses 721*g* locally recessed in the z-direction are formed on the upper surface 721*e* of the base 721. Seven recesses 721*g* are formed on the base 721. These seven recesses 721*g* are arranged so as to be separated from each other in the x-direction. These seven recesses 721*g* are arranged in a manner that they face the first embedded portion 711*a* to the seventh embedded portion 717*a* in the z-direction, respectively.

The current sensor 730 is provided on the upper surface 721*e*. The first MEC unit 731 to the seventh MEC unit 737 are provided in cavities of seven recesses 721*g* described above, respectively. Mounting surface 738*a* of the MEC unit on the sensor substrate 738 is provided on the upper surface 721*e*. The mounting surface 738*a* faces in the z-direction.

Protrusions 721*h* protruding in the z-direction is formed between two recesses 721*g* arranged apart from each other in the x-direction on the upper surface 721*e*. The sensor board 738 is formed with through holes through which these protrusions 721*h* are passed. After the protrusion 721*h* is passed through the through hole, a tip of the protrusion 721*h* is thermally caulked. Further, the sensor board 738 is bolted to the base 721. As a result, the sensor board 738 is fixed to the base 721. The relative positions of the seven MEC units with respect to seven connection bus bars are determined.

Current Sensor

As described above, the current sensor 730 has a first MEC unit 731 to a seventh MEC unit 737. Each one of seven MEC unit has a plurality of magneto-resistive elements whose resistance value changes according to a magnetic field transmitting therethrough, i.e., a transmitting magnetic field. The resistance value of this magneto-resistive element changes according to a component in a direction along the mounting surface 738*a* in the transmitting magnetic field. That is, the resistance of the magneto-resistive element changes according to the component along the x-direction and the component along the y-direction in the transmitting magnetic field.

On the other hand, the resistance of the magneto-resistive element does not change in response to the transmitted magnetic field along the z-direction. Therefore, even when an external noise along the z-direction passes through the magneto-resistive element, the resistance of the magneto-resistive element does not change.

The magneto-resistive element has a pinned layer having a fixed magnetization direction, a free layer whose magnetization direction changes according to a transmitted magnetic field, and a nonmagnetic intermediate layer arranged between two layers. When the intermediate layer has non-conductivity, the magneto-resistive element is a giant magneto-resistive element. When the intermediate layer has conductivity, the magneto-resistive element is a tunnel magneto-resistive element. The magneto-resistive element may be an anisotropic magneto-resistance effect element (AMR). Alternatively, the MEC unit may have the Hall element instead of the magneto-resistive element.

The resistance of the magneto-resistive element changes depending on the angle between the magnetization directions of the pinned layer and the free layer. The magnetization direction of the pinned layer is the direction facing the z-direction. The magnetization direction of the free layer is determined by components along the direction facing the z-direction in the transmitted magnetic field. The resistance of the magneto-resistive element becomes minimum when the magnetization directions of the free layer and the fixed layer are parallel to each other. The resistance of the magneto-resistive element becomes maximum when the magnetization directions of the free layer and the fixed layer are antiparallel to each other.

Each of the seven MEC units has a bridge circuit including a first magneto-resistive effect element and a second magneto-resistive effect element in which the magnetization directions of the pinned layers are inverted. Further, one of the seven MEC units and the sensor board 738 has a differential amplifier, a feedback coil, and a shunt resistor.

A bridge circuit is connected to an inverting input terminal and a non-inverting input terminal of the differential amplifier. The feedback coil and the shunt resistor are connected in series to the output terminal of the differential amplifier. The differential amplifier is virtually short-circuited by a feedback circuit (not shown).

Due to the connection configuration shown above, a current corresponding to the transmitted magnetic field flows through the input terminal of the differential amplifier. The differential amplifier operates so that the inverting input terminal and the non-inverting input terminal have the same potential. That is, the differential amplifier operates so that the current flowing through the input terminal and the current flowing through the output terminal become zero. Therefore, a current (feedback current) corresponding to the transmitted magnetic field flows from the output terminal of the differential amplifier.

This feedback current flows through the feedback coil and the shunt resistor. The flow of this feedback current creates a canceling magnetic field in the feedback coil. This canceling magnetic field passes through the MEC unit. This cancels out the magnetic field to be measured that passes through the MEC unit. As described above, the MEC unit operates so that the measurement object magnetic field transmitted therethrough and the cancellation magnetic field are balanced.

A feedback voltage corresponding to an amount of the feedback current that generates the canceling magnetic field is generated at the intermediate point between the feedback coil and the shunt resistor. This feedback voltage is input to the MGECU of the control circuit board via the output pin 723*a* as an electric signal for detecting the measured current.

As described above, each one of the first MEC unit 731 to the seventh MEC unit 737 is mounted on the mounting surface 738*a* of the sensor board 738. These seven MEC units are arranged so as to be separated from each other in the x-direction. More specifically, from the left surface 721*a* to the right surface 721*b*, the fifth MEC unit 735, the sixth MEC unit 736, the seventh MEC unit 737, the first MEC unit 731, the second MEC unit 732, the third MEC unit 733 and the fourth MEC unit 734 are arranged in this order.

The fifth MEC unit 735 to the seventh MEC unit 737 are arranged to face three of the first extension portions 719*a* of the fifth embedded portion 715*a* to the seventh buried portion 717*a* in the z-direction, respectively. Therefore, the magnetic field generated from the alternating current flowing through the second MG 402 is transmitted to the fifth MEC unit 735 to the seventh MEC unit 737. The fifth MEC unit 735 to the seventh MEC unit 737 detect the alternating current flowing through the second MG 402.

The first MEC unit 731 is arranged to face the first extension portion 719*a* of the first embedded portion 711*a* in the z-direction. Therefore, the magnetic field generated from the direct current flowing through the converter 310 is transmitted to the first MEC unit 731. The first MEC unit 731 detects the direct current flowing through the converter 310.

The second MEC unit 732 to the fourth MEC unit 734 are arranged to face three of the first extension portions 719*a* of the second embedded portion 712*a* to the fourth embedded portion 714*a* in the z-direction, respectively. Therefore, the magnetic field generated from the alternating current flowing through the first MG 401 is transmitted to the second MEC unit 732 to the fourth MEC unit 734. The second MEC unit 732 to the fourth MEC unit 734 detect the alternating current flowing through the first MG 401.

The alternating current and the direct current detected by these seven MEC units are input to the control circuit board. The MGECU provided on the control circuit board performs a vector-control on the motor 400 based on a detected alternating current, a rotation angle of the motor 400 detected by the rotation angle sensor (not shown), and the like. Further, the MGECU outputs the detected direct current to another ECU such as a battery ECU.

Front Shield (Shielding Shield)

As described above, the front shield 740 has a first front shield 741 to a seventh front shield 747. These seven front shields have a thin flat plate shape in the z-direction. The seven front shields are insert-molded into the base 721 in such a manner that they are arranged apart from each other in the x-direction. The seven front shields are arranged to face the seven embedded portions in the z-direction, respectively. Components of the magnetic field in the direction facing the z-direction are likely to be positively transmitted through these plurality of front shields.

Resin Cover

The resin cover 750 is made of an insulating resin material. The resin cover 750 has a substantially rectangular parallelepiped shape with the x-direction as the longitudinal direction. The resin cover 750 has an inner surface 750*a* and an outer surface 750*b* arranged in the z-direction. The resin cover 750 is disposed on the upper surface 721*e* side of the base 721 in a manner that the inner surface 750*a* faces the sensor substrate 738 in the z-direction.

A nut is insert-molded on the resin cover 750. The shaft portion of the bolt 753 is passed through this nut. Then, this bolt 753 is fastened to the base 721.

Back Shield (Opposite Shield)

As described above, the back shield 760 has a first back shield 761 to a seventh back shield 767. These seven back shields have a thin flat plate shape in the z-direction. The seven back shields are insert-molded into the resin cover 750 in a manner that it is separated from each other in the x-direction. Components of the magnetic field in the direction facing the z-direction are likely to be positively transmitted through these plurality of back shields.

Each of the seven back shields is aligned with each of the seven front shields in the z-direction in a condition where the resin cover 750 is fixed to the base 721 by bolts 753. Seven embedded portions and seven MEC units are located between the seven back shields and the seven front shields.

More specifically, in the z-direction, the first extension portion 719*a* of the fifth embedded portion 715*a* and the fifth MEC unit 735 are located between the fifth front shield 745 and the fifth back shield 765. The first extension portion 719*a* of the sixth embedded portion 716*a* and the sixth MEC unit 736 are located between the sixth front shield 746 and the sixth back shield 766. The first extension portion 719*a* of the seventh embedded portion 717*a* and the seventh MEC unit 737 are located between the seventh front shield 747 and the seventh back shield 767.

In the z-direction, the first extension portion 719*a* of the first embedded portion 711*a* and the first MEC unit 731 are located between the first front shield 741 and the first back shield 761.

In the z-direction, the first extension portion 719*a* of the second embedded portion 712*a* and the second MEC unit 732 are located between the second front shield 742 and the second back shield 762. The first extension portion 719*a* of the third embedded portion 713*a* and the third MEC unit 733 are located between the third front shield 743 and the third back shield 763. The first extension portion 719*a* of the fourth embedded portion 714*a* and the fourth MEC unit 734 are located between the fourth front shield 744 and the fourth back shield 764.

Nut Box

Figure 8:
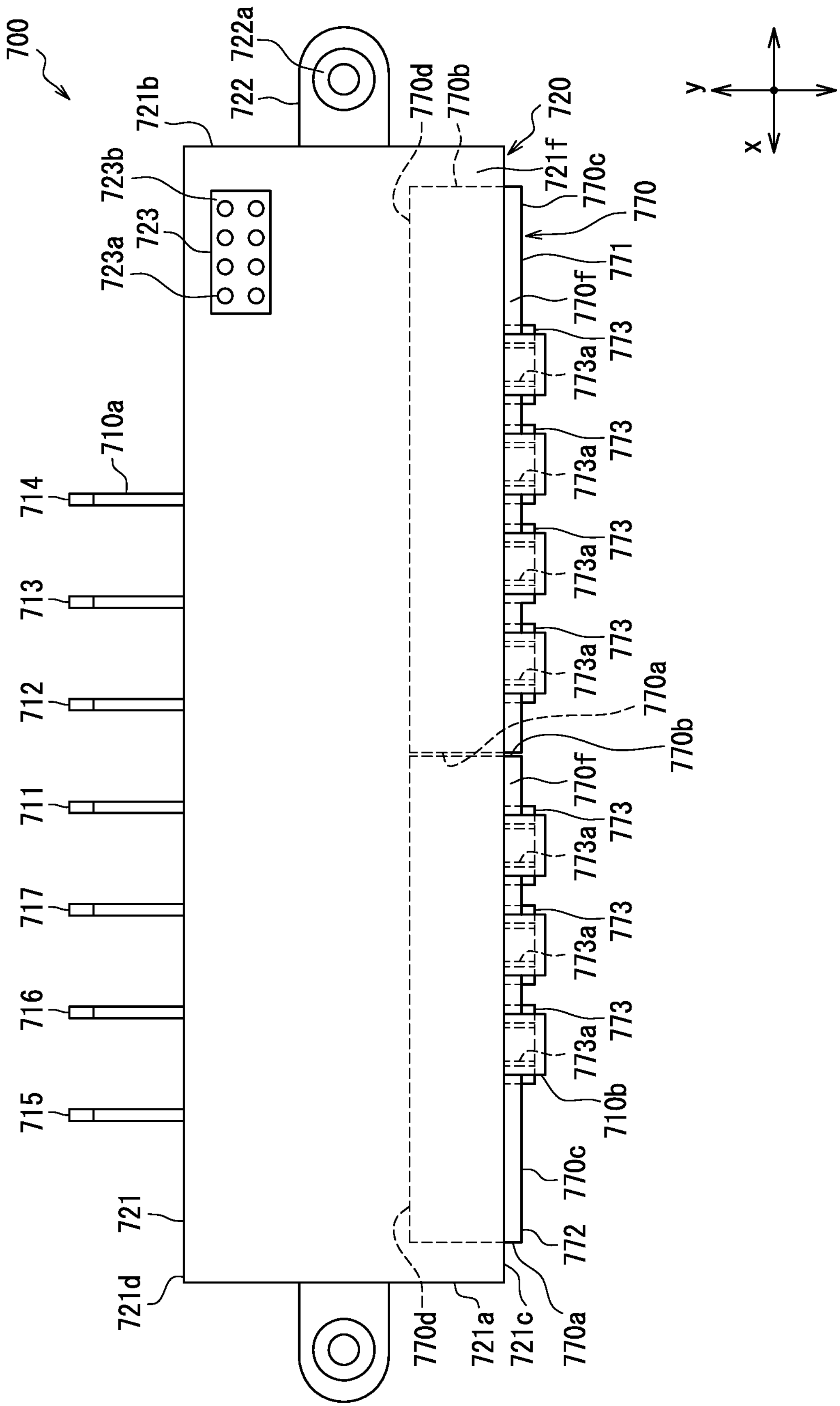
FIG. 8 is a bottom view of the sensor unit.

As shown in FIGS. 7, 8 and 9, the nut box 770 has a first resin body 771 and a second resin body 772, and a plurality of nuts 773 partially embedded therein.

The first resin body 771 and the second resin body 772 are made of an insulating resin material. In the present embodiment, the first resin body 771 and the second resin body 772 are made of the same resin material as the base 721.

The first resin body 771 and the second resin body 772 have a rectangular parallelepiped shape. Therefore, each of these resin bodies has a first horizontal surface 770*a* and a second horizontal surface 770*b* distanced in the x-direction, a first vertical surface 770*c* and a second vertical surface 770*d* distanced in the y-direction, and a first end surface 770*e* and a second end surface 770*f* distanced in the z-direction.

The first resin body 771 and the second resin body 772 have the x-direction as the longitudinal direction. However, each of these resin bodies has a shorter length in the x-direction than the base 721 (terminal block 720). Therefore, each of these resin bodies is less likely to warp due to thermal expansion and contraction in a direction orthogonal to the x-direction than the terminal block 720.

The first resin body 771 and the second resin body 772 have the y-direction and the z-direction as the short hand directions. However, each of these resin bodies has a shorter length in the x-direction than the base 721 (terminal block 720). Therefore, each of these resin bodies has a higher rigidity in the z-direction than the terminal block 720. Each of these resin bodies has a longer length in the z-direction than the portions extending in the z-direction of the other end 710*b* of the connection bus bar.

Further, the length of the first resin body 771 is longer in the x-direction than that of the second resin body 772. The first resin body 771 is longer in the x-direction than a total length of the second extension portions 719*b* of the first connection bus bar 711 to the fourth connection bus bar 714 arranged in the x-direction. The first resin body 771 is longer in the x-direction than a total length of the second extension portions 719*b* of the first connection bus bar 711 to the fourth connection bus bar 714 arranged in the x-direction.

A recess locally recessed in the y-direction is formed on the first vertical surface 770*c* of each of the first resin body 771 and the second resin body 772. A nut 773 is press-fitted into this recess. By this press fitting, one of the two openings of the bolt hole 773*a* provided in the nut 773 is closed by the wall surface of the resin body. On the other hand, the other of the two openings of the bolt hole 773*a* is open in the y-direction.

The first resin body 771 is formed with a total of four recesses arranged in a manner that they are spaced apart from each other in the y-direction. A total of three recesses are formed in the second resin body 772 in a manner that they are spaced apart from each other in the y-direction. Seven nuts 773 are individually press-fitted into each of these seven recesses.

Each of the first resin body 771 and the second resin body 772 is formed with a fixing hole 770*g* that opens in the first end surface 770*e* and the second end surface 770*f*. The fixing hole 770*g* has a first open hole 770*h* and a second open hole 770*i* arranged apart from each other in the z-direction, and a bolt shaft through hole 770*j* communication two open holes 770*h* and 770*i*. The first opening hole 770*h* is open to the first end surface 770*e*. The second opening hole 770*i* is open to the second end surface 770*f*. The bolt shaft through holes 770*j* are open to the bottom surface for partitioning a part of the first opening hole 770*h* and the bottom surface for partitioning a part of the second opening hole 770*i*, respectively. The bolt shaft through hole 770*j* has a smaller diameter than the first opening hole 770*h* and the second opening hole 770*i*, respectively.

Two of the above-mentioned fixing holes 770*g* are formed in each of the first resin body 771 and the second resin body 772. The two fixing holes 770*g* are separated in the x-direction. One of the two fixing holes 770*g* is formed on the first lateral surface 770*a* side. The remaining one fixing hole 770*g* is formed on the second lateral surface 770*b* side. Four nuts 773 are located between the two fixing holes 770*g* formed in the first resin body 771. Three nuts 773 are located between the two fixing holes 770*g* formed in the second resin body 772.

As described above, a plurality of pillar portions 725 are formed on the upper surface 721*e* of the base 721. In this embodiment, a total of four pillars 725 are formed on the upper surface 721*e*. These four pillars 725 are arranged so as to be separated from each other in the x-direction.

One of the four pillars 725 is located between the second extension portion 719*b* of the seventh connection bus bar 717 and the second extension portion 719*b* of the first connection bus bar 711 in the x-direction. One of the remaining three is located between the second extension portion 719*b* of the fourth connection bus bar 714 and the right surface 721*b* of the base 721. The second extension portions 719*b* of the first connection bus bar 711 to the fourth connection bus bar 714 are located between these two pillar portions 725. These two pillars 725 are inserted into the fixing holes 770*g* of the first resin body 771.

One of the remaining two pillars 725 is located between the left surface 721*a* of the base 721 and the first extension portion 719*a* of the fifth connection bus bar 715 in the x-direction. The last pillar portion 725 is located between the second extension portion 719*b* of the seventh connection bus bar 717 and the second extension portion 719*b* of the first connection bus bar 711 in the x-direction. The fifth connection bus bar 715 to the seventh connection bus bar 717 are located between these two pillars 725. These two pillars 725 are inserted into the fixing holes 770*g* of the second resin body 772.

The tip end side of the pillar portion 725 is inserted inside the opening of the second opening hole 770*i*. By this insertion, the tip surface of the pillar portion 725 comes into contact with the bottom surface which partitions a part of the second opening hole 770*i*. The pillar portion 725 is formed with a bolt hole 725*a* which opens on the tip surface thereof. The bolt hole 725*a* and the bolt shaft through hole 770*j* of the fixing hole 770*g* are placed continuous each other in the z-direction.

A fixing bolt 774 is inserted inside the opening of the first opening hole 770*h*. A shaft portion of the fixing bolt 774 is passed through the bolt shaft through hole 770*j* and the bolt hole 725*a*. Then, the tip end side of the shaft portion of the fixing bolt 774 is fastened to a screw groove formed on a wall surface forming the bolt hole 725*a*. A head of the fixing bolt 774 comes into contact with the bottom surface which partitions a part of the first opening hole 770*h*. As a result, the first resin body 771 and the second resin body 772 are each bolted to the base 721.

In this bolted state, four nuts 773 embedded in the first resin body 771 and the other ends 710*b* of the first connection bus bar 711 to the fourth connection bus bar 714 are lined up in the y-direction, respectively. Three nuts 773 embedded in the second resin body 772 and the other ends 710*b* of the fifth connection bus bar 715 to the seventh connection bus bar 717 are lined up in the y-direction, respectively. The bolt hole 773*a* of the nut 773 and the through hole 710*c* of the other end 710*b* are placed continuous each other in the y-direction.

Although not shown, an inner bus bar is arranged to face the other end 710*b* of the first connection bus bar 711. As a result, the through hole 710*c* formed in the other end 710*b* and the through hole formed in the inner bus bar are placed continuous each other in the y-direction. Six outer bus bars are individually arranged to face the other ends 710*b* of the second connection bus bar 712 to the seventh connection bus bar 717, respectively. As a result, the through hole 710*c* formed in the other end 710*b* and the through hole formed in the outer bus bar are placed continuous each other in the y-direction.

As described above, two through holes formed in the bus bars and one bolt hole 773*a* provided in the nut 773 form a single continuous hole in the y-direction. The shaft of the bolt is inserted to pass through this hole. Then, the tip end side of the shaft portion of the bolt is fastened to the bolt hole 773*a*.

As a result, the other end 710*b* of the first connection bus bar 711 and the inner bus bar are sandwiched between the nut 773 and the head of the bolt. The other ends 710*b* of the second connection bus bar 712 to the seventh connection bus bar 717 and the six outer bus bars are individually sandwiched between the six nuts 773 and the heads of the six bolts.

As a result, one inner bus bar and six outer bus bars are mechanically and electrically connected to the seven connected bus bars, respectively. At the same time, seven connection bus bars are connected to the seven nuts 773. A partially embedded connection bus bar is connected to the base 721 and a partially embedded nut 773 is connected to the resin body. That is, the terminal block 720 and the nut box 770 are mechanically connected.

Operation and Advantage

As described above, the base 721 of the terminal block 720 is formed with four pillars 725 separated in the x-direction. The first resin body 771 of the nut box 770 is fixed to two of these four pillars 725 by the fixing bolts 774. The second resin body 772 is fixed to the remaining two pillars 725 by the fixing bolt 774.

In this way, the first resin body 771 and the second resin body 772 are each connected to the base 721 at a plurality of fixed points. And a plurality of fixed points are separated in the x-direction. Due to this connection configuration, the terminal block 720 is prevented from warping due to thermal expansion and contraction. It is possible to prevent a change in the relative positional relationships between the plurality of MEC units provided on the terminal block 720 and the plurality of connected bus bars connected to the terminal block 720. Fluctuations in the magnetic field transmitted through the MEC unit are suppressed. The decrease in the current detection accuracy of the current sensor 730 is suppressed.

The first resin body 771 and the second resin body 772 have a shorter length in the x-direction than the base 721 (terminal block 720), and are less likely to warp in the direction orthogonal to the x-direction due to thermal expansion and contraction. Further, the first resin body 771 and the second resin body 772 are longer in the z-direction than the base 721, and have higher rigidity in the z-direction. These resin bodies are fixed to the base 721 at a plurality of fixing points. Therefore, it is effectively suppressed that the base 721 (terminal block 720) is warped due to thermal expansion and contraction.

Further, the first connection bus bar 711 to the seventh connection bus bar 717 are bolted to the nut 773 embedded in each of the first resin body 771 and the second resin body 772. As a result, the first resin body 771 and the second resin body 772 are each connected to the base 721. In this way, the connection points (fixing points) between the terminal block 720 and the nut box 770 increase. Therefore, the terminal block 720 is effectively suppressed from warping due to thermal expansion and contraction.

The first front shield 741 to the seventh front shield 747 are insert-molded in the terminal block 720 in a manner that they are arranged in the x-direction.

As described above, warpage of the terminal block 720 is suppressed. Therefore, it is possible to prevent the positions of the plurality of front shields integrally connected to the terminal block 720 from being displaced due to a warping of the terminal block 720. It is possible to reduce changes in relative positional relationships between the plurality of MEC units and the plurality of front shields provided in the terminal block 720.

The resin cover 750, in which the first back shield 761 to the seventh back shield 767 are insert-molded in such a manner arranging them in the x-direction, is provided on the terminal block 720. The MEC unit and the embedded portion arranged to face each other in the z-direction are located between one front shield and one back shield.

According to this, entering external noise to the MEC unit is suppressed by the front shield and the back shield. At the same time, the distribution of the magnetic field generated from the current flowing through the embedded portion is regulated by the front shield and the back shield.

In the following description, in order to simplify description, assume a pair of neighboring embedded portions among the first embedded portion 711*a* to the seventh embedded portion 717*a*, shown in FIGS. 3 and 4. A right one of the pair of neighboring embedded portions may be referred to as a right side embedded portion and a left one of the pair of neighboring embedded portions may be referred to as a right side embedded portion. For example, in the case the left embedded portion is the first embedded portion 711*a*, the right embedded portion is the second embedded portion 712*a*.

As shown in FIGS. 3 and 4, the left embedded portion and the right embedded portion are parallel in the x-direction. In other word, the left embedded portion and the right embedded portion are arranged in a side by side manner in the x-direction. As shown in FIGS. 3 and 4, one of the first extension portion 719*a* of the left embedded portion is arranged with the first extension portion 719*a*, the shift portion 718, and a part of the second extension portion 719*b* on a side to the shift portion 718 of the right embedded portion in a side by side manner in the x-direction. A part of the first extension portion 719*a* on a side to the shift portion 718, the shift portion 718, and the second extension portion 719*b* of the left embedded portion are arranged with the second extension portion 719*b* of the right embedded portion in a side by side manner in the x-direction The shift portion 718 of the left embedded portion and the shift portion 718 of the right embedded portion are arranged in the y-direction. The left embedded portion and the right embedded portion are integrally connected by a material of forming the base 721 located between them.

Due to this configuration, the rigidity of the terminal block 720 in the x-direction and the y-direction is increased. The positions of the plurality of connection bus bars integrally connected to the terminal block 720 in the x-direction and the y-direction are suppressed from being displaced due to vibration, thermal expansion and contraction, or the like. It is possible to reduce changes in relative positional relationships between the plurality of MEC units, the plurality of connection bus bars, and the plurality of front shields provided on the terminal block 720. As a result, the fluctuation of the magnetic field transmitted through the MEC unit is suppressed, and the deterioration of the current detection accuracy of the current sensor 730 is suppressed.

The first extension portion 719*a* and the MEC unit are lined up in the z-direction. The one end 710*a* extending in the same direction integrally with the first extension portion 719*a* is welded and joined to the intermediate point terminal 330*c* of the switch module. On the other hand, the inner bus bar and the outer bus bar are bolted to the other end 710*b* whose connecting portion extends in the same direction integrally with the second extension portion 719*b*.

The extension directions of the first extension portion 719*a* and the shift portion 718 are orthogonal to each other. The extension directions of the shift portion 718 and the second extension portion 719*b* are orthogonal to each other.

As described above, it is possible to prevent a shape of the first extension portion 719*a* from being distorted due to the stress acting on the connection bus bar when the other end 710*b* is bolted. Changes in the relative positional relationship between the first extension portion 719*a* and the MEC unit are suppressed. Fluctuations in the magnetic field transmitted through the MEC unit are suppressed.

Although the present disclosure is described with reference to the preferred embodiment, the present disclosure is not limited to the above-described embodiment but may be implemented with various modifications without departing from the spirit of the present disclosure.

First Modification

In the present embodiment, the description shows examples in which the other ends 710*b* of seven connection bus bars are extended in a protruding manner from the front surface 721*c* in the y-direction, then they are bent and extended from the lower surface 721*f* toward the upper surface 721*e* in the z-direction. The other end 710*b* may extend from the upper surface 721*e* toward the lower surface 721*f* in the z-direction. In this case, the nut box 770 is provided on the lower surface 721*f* side of the base 721.

Second Modification

In the present embodiment, the description shows examples in which the fixing holes 770*g* are formed in the first resin body 771 and the second resin body 772, the pillar portions 725 are formed in the base 721, and the pillar portions 725 are inserted into the fixing holes 770*g*. However, on the contrary, it is also possible to adopt a configuration in which pillar portions are formed in the first resin body 771 and the second resin body 772, fixing holes are formed in the base 721, and the pillar portions are inserted into the fixing holes.

Third Modification

In the embodiment, an example is shown in which the inverter 320 includes the six modules including the U-phase switch module 322 to the Z-phase switch module 327. However, it is also possible to adopt a configuration in which the inverter 320 includes three modules including the X-phase switch module 325 to the Z-phase switch module 327.

Figure 10:
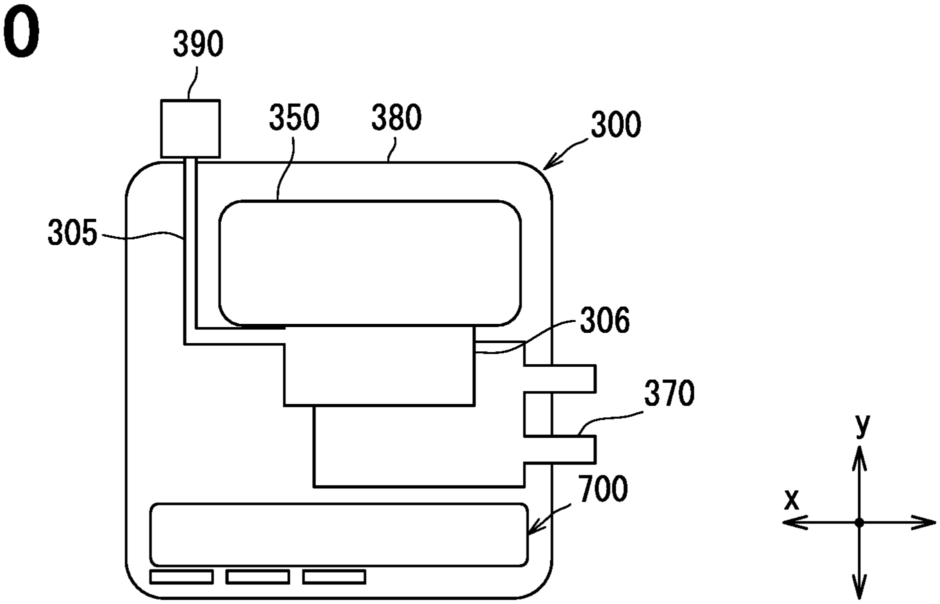
FIG. 10 is a schematic diagram illustrating a power conversion device of a modified embodiment.
Figure 11:
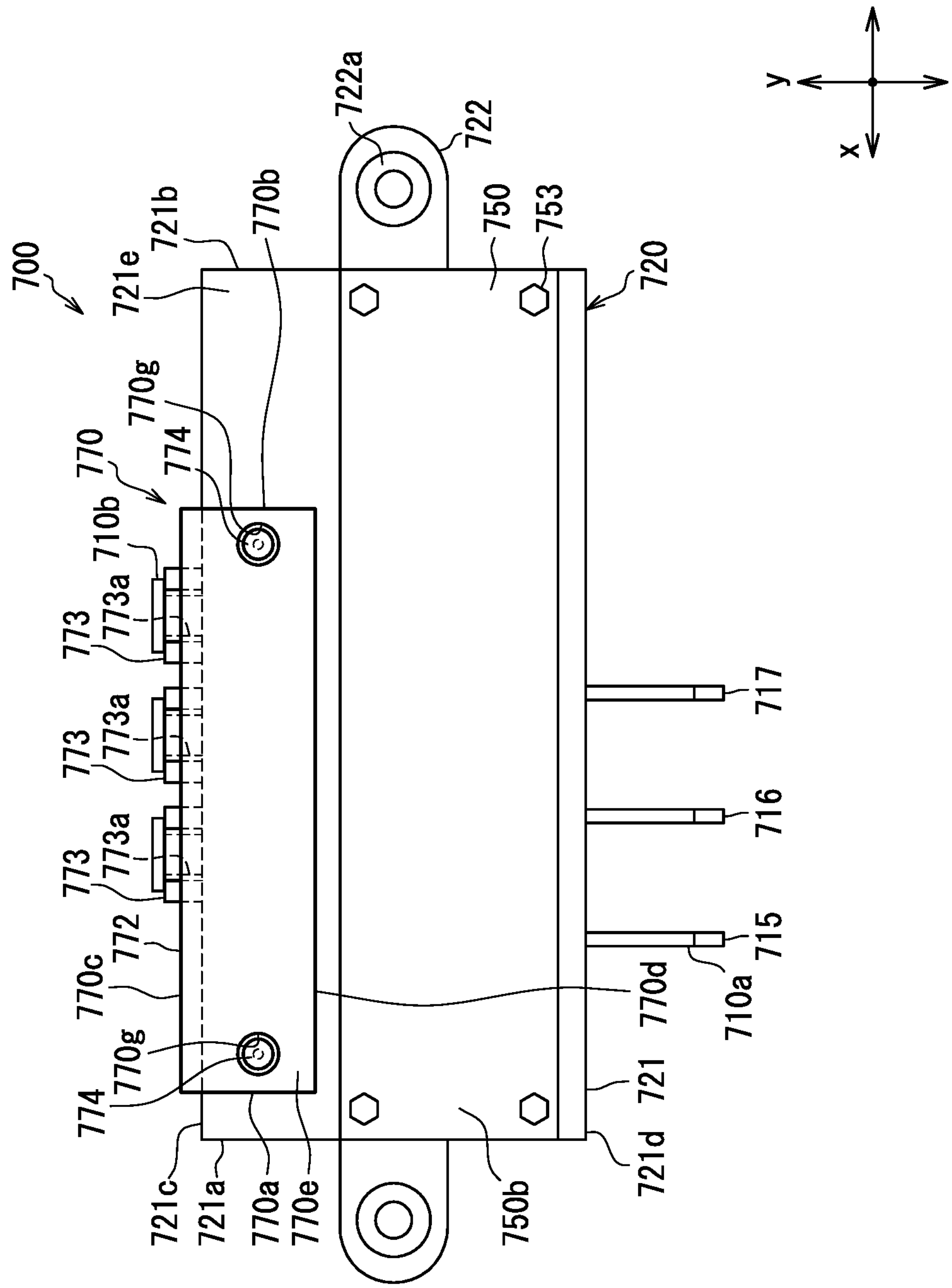
FIG. 11 is a cross-sectional view illustrating a sensor unit of a modified embodiment.
Figure 12:
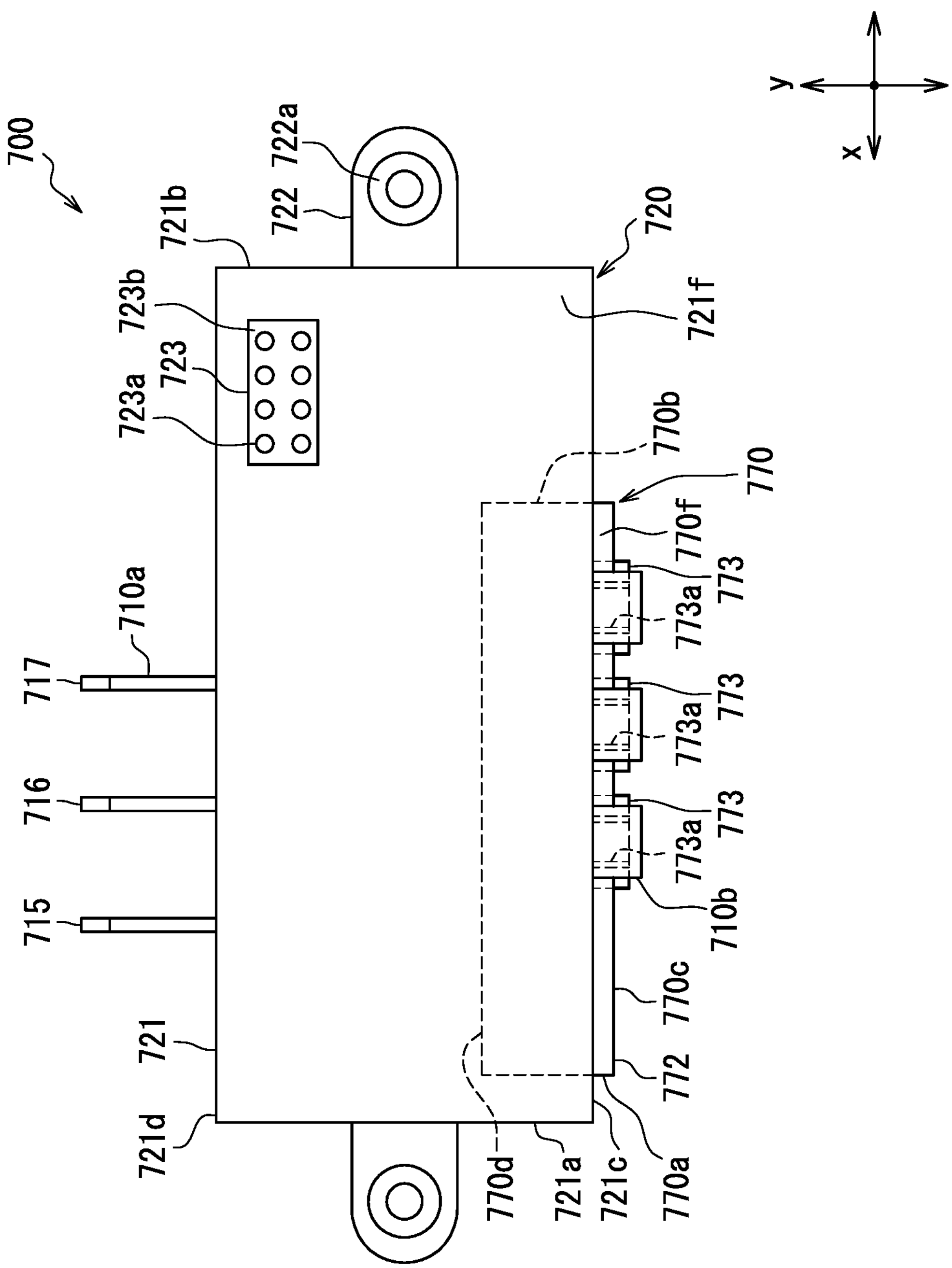
FIG. 12 is a cross-sectional view illustrating a sensor unit of a modified embodiment.
Figure 13:
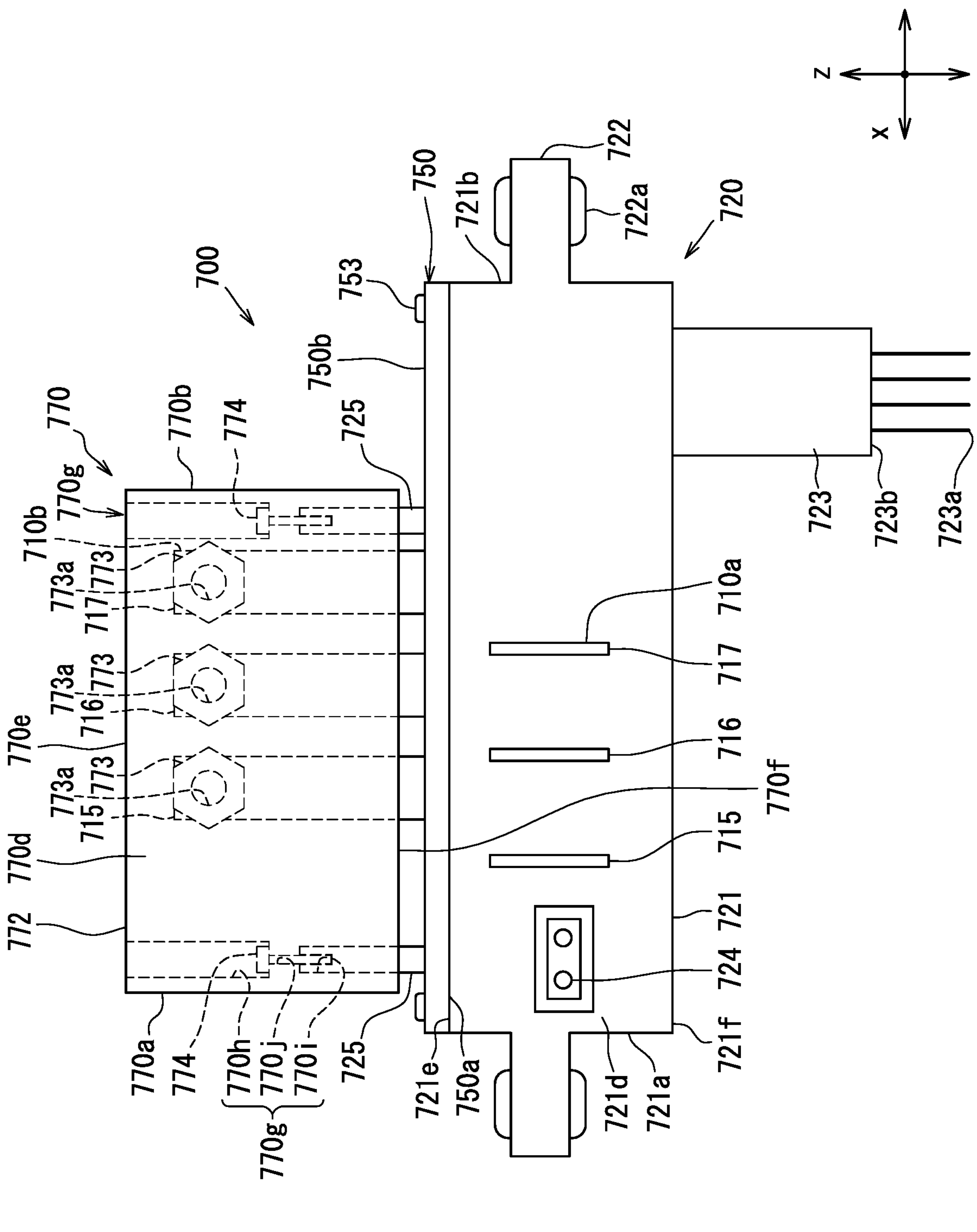
FIG. 13 is a cross-sectional view illustrating a sensor unit of a modified embodiment.

In the embodiment, an example is shown in which the power conversion device 300 includes the converter 310 and the inverter 320. However, for example, as shown in FIG. 10, the power conversion device 300 may include only the inverter 320. In this case, for example, as shown in FIGS. 11, 12, and 13, three connection bus bars are insert-molded in the terminal block 720. The nut box 770 has a second resin body 772 and three nuts 773.

Fourth Modification

In this embodiment, an example is shown in which the first extension portion 719*a* and the MEC unit are lined up in the z-direction. However, unlike this, it is also possible to adopt a configuration in which the second extension portion 719*b* and the MEC unit are lined up in the z-direction.

As described in this embodiment, the one end 710*a* of the connection bus bar is joined to the intermediate point terminal 330*c* of the switch module. The outer bus bar is bolted to a part of the other end 710*b*. The outer bus bar is connected to the motor 400 via a wire harness.

Therefore, if the switch module is vibrated due to, for example, an electromagnetic force generated by an electric current flow, the vibration is transmitted to the one end 710*a* (first extension portion 719*a*) of the connection bus bar joined to the intermediate point terminal 330*c* of the switch module. This vibration tends to be transmitted to the second extension portion 719*b* via the shift portion 718.

However, the extension directions of the first extension portion 719*a* and the shift portion 718 are orthogonal to each other, and the extension directions of the shift portion 718 and the second extension portion 719*b* are orthogonal to each other. Therefore, the transmission of vibration from the first extension portion 719*a* to the shift portion 718 is suppressed at the connection portion between them. The transmission of vibration from the shift portion 718 to the second extension portion 719*b* is suppressed at the connection portion between them.

Further, the vibration of the motor 400 may be transmitted to the other ends 710*b* of the second connection bus bar 712 to the seventh connection bus bar 717. However, the outer bus bar connected to the other end 710*b* (second extension portion 719*b*) is connected to the motor 400 via a wire harness. Therefore, the transmission of vibration from the motor 400 to the second extension portion 719*b* is suppressed by the wire harness.

As shown above, vibrating the second extension portion 719*b* by the vibration of the switch module and the motor 400 is suppressed. Therefore, it is possible to suppress a change in the relative positional relationship between the second extension portion 719*b* and the MEC unit arranged in the z-direction. Fluctuations in the magnetic field transmitted through the MEC unit are suppressed, and a decrease in current detection accuracy is suppressed.

Fifth Modification

It is also possible to adopt a configuration in which the shift portion 718 and the MEC unit are lined up in the z-direction.

In this case, since the extension directions of the first extension portion 719*a* and the shift portion 718 are orthogonal to each other, the vibration generated by the switch module joined at the one end 710*a* is suppressed from being transmitted to the shift portion 718. Since extending directions of the second extension portion 719*b* and the shift portion 718 are orthogonal to each other, it is possible to prevent a shape of the shift portion 718 from being distorted by the stress acting on the connection bus bar when bolting the other end 710*b*. Therefore, it is possible to suppress a change in the relative positional relationship between the shift portions 718 and the MEC unit arranged in the z-direction.

Sixth Modification

In this embodiment, an example is shown in which the front shield 740 and the back shield 760 each have a thin flat plate shape in the z-direction. However, the shape of the shield is not particularly limited. For example, it is possible to adopt a shape in which each of the front shield and the back shield has a flat plate portion having a thin thickness in the z-direction and a side plate portion extending in the z-direction from both ends of the flat plate portion in the x-direction. By making the tip surfaces of the side plate portions of the front shield and the back shield face each other in the z-direction, it is possible to adopt a configuration in which the MEC unit and the embedded portion are surrounded by these two shields. Furthermore, it is possible to adopt a configuration in which the sensor unit 700 has only one of the front shield 740 and the back shield 760.

Other Modifications

The embodiment shows examples in which the power conversion device 300 including the sensor unit 700 is applied to the in-vehicle system 100 constituting a hybrid system. However, the application of the power conversion device 300 is not particularly limited to the above example. For example, it is possible to adopt a configuration in which the power conversion device 300 is applied to an in-vehicle system of an electric vehicle.

What is claimed is:

1. A sensor unit, comprising:

a plurality of bus bars arranged separately in a first predetermined direction and individually connected to each of a plurality of switch modules constituting a part of a power conversion circuit;

an insulating resin case extending in the first predetermined direction and connecting the plurality of bus bars by having embedded in resin constituting the resin case a part of each of the bus bars;

a plurality of magnetic-electric converters that (i) are disposed in the resin case so that the magnetic-electric converters face embedded portions of the bus bars, which are embedded in the resin case, in a second predetermined direction intersecting the first predetermined direction and (ii) are configured to detect currents flowing through the bus bars due to respective magnetic fields generated by flow of the currents through the bus bars; and a support body that (i) includes an insulating resin body, (ii) extends along the plurality of bus bars in the second predetermined direction, (iii) extends in the first predetermined direction, and (iv) is connected to the resin case at two fixing points separated in the first predetermined direction, wherein the insulating resin case further includes two pillar portions that extend in the second direction and are arranged at the two fixing points so as to be separated from each other in the first direction, the support body:

has two fixing holes that extend in the second direction and are arranged at the two fixing points so as to be separated from each other in the first direction, the two pillar portions being inserted into the two fixing holes to connect the insulating resin case and the support body at the two fixing points;

has a longer length in the second predetermined direction than the resin case and has a higher rigidity than the resin case; and suppresses the resin case from warping to prevent changes in relative positional relationships between the plurality of magnetic-electric converters and the plurality of bus bars, and the sensor unit further comprises a plurality of fixing bolts (i) that respectively pass through bolt shaft through holes formed on bottoms of the fixing holes and (ii) that are respectively fastened to screw grooves on wall surfaces forming bolt holes on tip ends of the pillar portions.

2. The sensor unit claimed in claim 1, wherein a plurality of nuts, which are arranged apart from each other in the first predetermined direction, are connected with the insulating resin body in a manner of being partially embedded, each of the plurality of bus bars includes a through hole formed in an exposed portion of the bus bar that is exposed from the resin case, and the plurality of nuts and the plurality of bus bars are arranged to face each other in a manner that a bolt hole of the nut and the through hole are placed in a continuous manner.

3. The sensor unit claimed in claim 1, further comprising:

a plurality of front shields that (i) are embedded in the resin case, (ii) are arranged separately in the first predetermined direction, and (iii) suppress entering of external noise to each of the magnetic-electric converters.

4. The sensor unit claimed in claim 3, further comprising:

an insulating resin cover fixed to the resin case; and a plurality of back shields that (i) are embedded in the resin cover, (ii) are arranged separately in the first predetermined direction, and (iii) suppress entering of external noise to each of the magnetic-electric converters, wherein the resin cover is fixed to the resin case so that a pair of the magnetic-electric converters and the embedded portion is placed between one of the plurality of the front shields and one of the plurality of the back shields.

5. The sensor unit claimed in claim 1, wherein each of the plurality of embedded portions has a shift portion that is shifted in the first predetermined direction from another portion of the embedded portion, and the shift portions of two of the embedded portions neighboring each other in the first predetermined direction are arranged separately in a third direction orthogonal to each of the first predetermined direction and the second predetermined direction.

6. A sensor unit, comprising:

a plurality of bus bars arranged separately in a first predetermined direction and individually connected to each of a plurality of switch modules constituting a part of a power conversion circuit;

an insulating resin case extending in the first predetermined direction and connecting the plurality of bus bars by having embedded in resin constituting the resin case a part of each of the bus bars;

a plurality of magnetic-electric converters that (i) are disposed in the resin case so that the magnetic-electric converters face embedded portions of the bus bars, which are embedded in the resin case, in a second predetermined direction intersecting the first predetermined direction and (ii) are configured to detect currents flowing through the bus bars due to respective magnetic fields generated by flow of the currents through bus bars; and a support body that (i) includes an insulating resin body, (ii) extends along the plurality of bus bars in the second predetermined direction, (iii) extends in the first predetermined direction, and (iv) is connected to the resin case at two fixing points separated in the first predetermined direction, wherein a plurality of nuts are arranged apart from each other in the first predetermined direction and are connected with the insulating resin body in a manner of being partially embedded, each of the plurality of bus bars includes a through hole formed in an exposed portion of the bus bar that is exposed from the resin case, the plurality of nuts and the plurality of bus bars are arranged to face each other in a manner that a bolt hole of the nut and the through hole are placed in a continuous manner, the insulating resin case further includes two pillar portions that extend in the second direction and are arranged at the two fixing points so as to be separated from each other in the first direction, the support body:

has two fixing holes that extend in the second direction and are arranged at the two fixing points so as to be separated from each other in the first direction, the two pillar portions being inserted into the two fixing holes to connect the insulating resin case and the support body at the two fixing points;

has a longer length in the second predetermined direction than the resin case and has a higher rigidity than the resin case; and suppresses the resin case from warping to prevent changes in relative positional relationships between the plurality of magnetic-electric converters and the plurality of bus bars, and the sensor unit further comprises a plurality of fixing bolts (i) that respectively pass through bolt shaft through holes formed on bottoms of the fixing holes and (ii) that are respectively fastened to screw grooves on wall surfaces forming bolt holes on tip ends of the pillar portions.

7. The sensor unit claimed in claim 6, further comprising:

a plurality of front shields that (i) are embedded in the resin case, (ii) are arranged separately in the first predetermined direction, and (iii) suppress entering of external noise to each of the magnetic-electric converters.

8. The sensor unit claimed in claim 7, further comprising:

an insulating resin cover fixed to the resin case; and a plurality of back shields that (i) are embedded in the resin cover, (ii) are arranged separately in the first predetermined direction, and (iii) suppress entering of external noise to each of the magnetic-electric converters, wherein the resin cover is fixed to the resin case so that a pair of the magnetic-electric converters and the embedded portion is placed between one of the plurality of the front shields and one of the plurality of the back shields.

9. The sensor unit claimed in claim 6, wherein each of the plurality of embedded portions has a shift portion that is shifted in the first predetermined direction from another portion of the embedded portion, and the shift portions of two of the embedded portions neighboring each other in the first predetermined direction are arranged separately in a third direction orthogonal to each of the first predetermined direction and the second predetermined direction.

* * * * *